United States Patent
Lin et al.

(10) Patent No.: US 12,369,329 B2
(45) Date of Patent: Jul. 22, 2025

(54) BOTTOM-ELECTRODE INTERFACE STRUCTURE FOR MEMORY

(71) Applicant: Taiwan Semiconductor Manufacturing Company, Ltd., Hsinchu (TW)

(72) Inventors: Tzu-Yu Lin, Taoyuan (TW); Chia-Wen Zhong, Taichung (TW); Yao-Wen Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 86 days.

(21) Appl. No.: 18/353,988

(22) Filed: Jul. 18, 2023

(65) Prior Publication Data

US 2023/0363178 A1    Nov. 9, 2023

Related U.S. Application Data

(62) Division of application No. 17/346,701, filed on Jun. 14, 2021, now Pat. No. 11,792,996.

(Continued)

(51) Int. Cl.
*H10B 53/30* (2023.01)
*H10B 12/00* (2023.01)
*H10D 1/68* (2025.01)

(52) U.S. Cl.
CPC ........... *H10B 53/30* (2023.02); *H10B 12/033* (2023.02); *H10D 1/688* (2025.01); *H10D 1/696* (2025.01)

(58) Field of Classification Search
CPC ......... H01L 28/55; H01L 28/56; H01L 28/57; H01L 28/75; H10B 12/033; H10B 53/30; H10D 1/688; H10D 1/696
See application file for complete search history.

(56) References Cited

U.S. PATENT DOCUMENTS 6,271,559 B1    8/2001  Iwasaki et al.
9,460,770 B1 *  10/2016 Nicholes ............. G11C 11/5657
(Continued)

FOREIGN PATENT DOCUMENTS

CN    104979470 A  * 10/2015 ............. H01L 45/08
EP       1117132 A1    7/2001
(Continued)

OTHER PUBLICATIONS

Yazdani et al. "A method to quantify crystallinity in amorphous metal alloys: A differential scanning calorimetry study" PLoS One. 2020; 15(6): e0234774, published on Jun. 22, 2020.
(Continued)

*Primary Examiner* — Matthew E Warren
(74) *Attorney, Agent, or Firm* — Eschweiler & Potashnik, LLC

(57) ABSTRACT

1. Various embodiments of the present disclosure are directed towards a ferroelectric random-access memory (FeRAM) cell or some other suitable type of memory cell comprising a bottom-electrode interface structure. The memory cell further comprises a bottom electrode, a switching layer over the bottom electrode, and a top electrode over the switching layer. The bottom-electrode interface structure separates the bottom electrode and the switching layer from each other. Further, the interface structure is dielectric and is configured to block or otherwise resist metal atoms and/or impurities in the bottom electrode from diffusing to the switching layer. By blocking or otherwise resisting such diffusion, leakage current may be decreased. Further, endurance of the memory cell may be increased.

20 Claims, 12 Drawing Sheets

Related U.S. Application Data

(60) Provisional application No. 63/174,124, filed on Apr. 13, 2021.

(56) References Cited

U.S. PATENT DOCUMENTS

| | | | |
|---|---|---|---|
| 10,210,920 | B1 | 2/2019 | Chen et al. |
| 10,892,345 | B2 * | 1/2021 | Moon .................. H01L 29/518 |
| 2006/0046344 | A1 | 3/2006 | Liljedahl et al. |
| 2006/0157763 | A1 | 7/2006 | Joo et al. |
| 2006/0270155 | A1 | 11/2006 | Hong |
| 2009/0061538 | A1 | 3/2009 | Heo et al. |
| 2009/0273882 | A1 * | 11/2009 | Park ........................ H01L 28/91 |
| | | | 361/305 |
| 2009/0275148 | A1 | 11/2009 | Udayakumar et al. |
| 2012/0107963 | A1 | 5/2012 | Wang |
| 2017/0133434 | A1 | 5/2017 | Ueki et al. |
| 2017/0141300 | A1 * | 5/2017 | Trinh ................... H10N 70/826 |
| 2019/0081096 | A1 | 3/2019 | Tomekawa et al. |
| 2019/0103151 | A1 * | 4/2019 | Nicholes ............. G11C 11/2275 |
| 2020/0091279 | A1 * | 3/2020 | Moon ............... H01L 21/02244 |
| 2020/0098985 | A1 | 3/2020 | Trinh et al. |
| 2021/0035992 | A1 | 2/2021 | Chen et al. |

FOREIGN PATENT DOCUMENTS

| | | |
|---|---|---|
| JP | 2008294345 A | 12/2008 |
| JP | 2011091329 A | 5/2011 |
| KR | 20020002596 A | 1/2002 |
| KR | 20110047839 A | 5/2011 |
| KR | 20220059878 A * | 5/2022 ............ H01L 28/40 |
| WO | 0017929 A1 | 3/2000 |

OTHER PUBLICATIONS

Kolawa et al. "Tantalum-Based Diffusion Barriers in Si/Cu VLSI Metallizations" J. Applied Physics, 70(3), published on Aug. 1, 1991.

Garcia et al. "Thermoelectric Properties of Doped-Cu3SbSe4 Compounds: A First-Principles Insight" Inorg. Chem. 2018, 57, 7321-7333, published on May 31, 2018.

Kim et al. "Diffusion Barrier Properties of Mo Compound Thin Films" Journal of the Korean Vacuum Society, vol. 6, No. 2, pp. 143-150, published on May 1, 1997. English Abstract Provided.

Non-Final Office Action dated Feb. 28, 2023 for U.S. Appl. No. 17/346,701.

Notice of Allowance dated Jun. 7, 2023 for U.S. Appl. No. 17/346,701.

Reid et al. "Evaluation of amorphous (Mo, Ta, W)-Si—N diffusion barriers for <si>[Cu metallizations" Thin Solid Films, 236 (1993) 319-324, published in 1993.

Lee et al. "The Improvement of Surface Roughness of Poly-Si,-xGex Thin Film Using Ar Plasma Treatment" Journal of the Korean Ceramic Society, vol. 34, No. 11 pp. 1121-1128, 1997. Published in 1997.

\* cited by examiner

BOTTOM-ELECTRODE INTERFACE STRUCTURE FOR MEMORY

REFERENCE TO RELATED APPLICATIONS

This Application is a Divisional of U.S. application Ser. No. 17/346,701, filed on Jun. 14, 2021, which claims the benefit of U.S. Provisional Application No. 63/174,124, filed on Apr. 13, 2021. The contents of the above-referenced Patent Applications are hereby incorporated by reference in their entirety.

BACKGROUND

Many modern-day electronic devices include non-volatile memory. Non-volatile memory is electronic memory that is able to store data in the absence of power. Some promising candidates for the next generation of non-volatile memory include ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
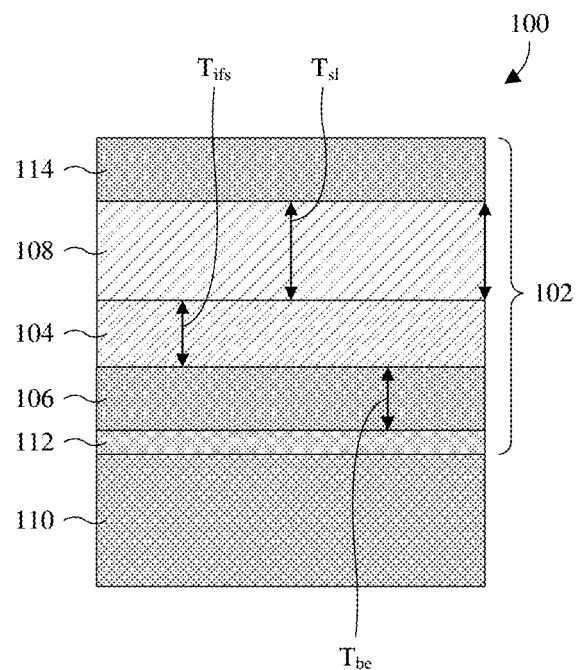
FIG. 1 illustrates a cross-sectional view of some embodiments of a memory cell comprising a bottom-electrode interface structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric random-access memory (FeRAM) cell may overlie a wire in an interconnect structure of an integrated circuit (IC) chip. The FeRAM cell may comprise a bottom electrode, a ferroelectric switching layer the bottom electrode, and a top electrode layer overlying the ferroelectric switching layer. The bottom electrode extends towards and electrically couples to the wire through a barrier layer. The barrier layer separates the bottom electrode from the wire and blocks migration of material from the wire to the bottom electrode.

A challenge with the FeRAM cell is that active metal atoms from the barrier layer may diffuse to the bottom electrode. Further, active metal atoms and/or impurities in the bottom electrode may diffuse from the bottom electrode to the ferroelectric switching layer. The active metal atoms have a high diffusion coefficient and may, for example, include copper atoms, tantalum atoms, other suitable metal atom(s), or any combination of the foregoing. The impurities may have diffused into the bottom electrode during deposition of the ferroelectric switching layer and may, for example, include chlorine ions and/or other suitable ions from precursors used during deposition of the ferroelectric switching layer. The active metal atoms and/or the impurities may increase leakage current and may hence degrade data retention.

Various embodiments of the present disclosure are directed towards an FeRAM cell or some other suitable type of memory cell comprising a bottom-electrode interface structure. The memory cell overlies a wire in an interconnect structure of an IC chip and further comprises a bottom electrode and a switching layer. To the extent that the memory cell is an FeRAM cell, the switching layer may be a ferroelectric switching layer. The bottom electrode extends towards and electrically couples to the wire through a barrier layer. The barrier layer separates the bottom electrode from the wire and is configured to block or otherwise reduce diffusion of active metal atoms from the wire to the bottom electrode. The switching layer overlies the bottom electrode and is separated from the bottom electrode by the bottom-electrode interface structure. The bottom-electrode interface structure is dielectric and is configured to block or otherwise reduce active metal atoms and/or impurities from diffusing to the switching layer from the bottom electrode. Such active metal atoms may, for example, migrate to the bottom electrode from the barrier layer or may otherwise originate at the bottom electrode.

By blocking or otherwise reducing active metal atoms and/or impurities from diffusing to the switching layer from the barrier layer and/or the bottom electrode, the bottom-electrode interface structure may reduce leakage current at the switching layer. By reducing leakage current at the switching layer, the bottom-electrode interface structure may enhance data retention of the memory cell and may hence enhances reliability of the memory cell. Further, the bottom-electrode interface structure may further be configured to block or otherwise reduce active metal atoms of the wire from diffusing to the switching layer, such that the barrier layer may be omitted. By omitting the barrier layer, material and processing costs may be reduced.

With reference to FIG. 1, a cross-sectional view 100 of some embodiments of a memory cell 102 comprising a bottom-electrode interface structure 104 is provided. As above, the bottom-electrode interface structure 104 is configured to block or otherwise reduce impurities and/or active metal atoms from diffusing from a bottom electrode 106 to a switching layer 108. This may reduce leakage current and may hence enhance endurance.

The memory cell 102 overlies a bottom metal structure 110 and may, for example, be a FeRAM cell, a resistive random-access memory (RRAM) cell, or some other suitable type of memory cell. The bottom metal structure 110 may, for example, be a wire, a via, a contact, or some other suitable structure. The memory cell 102 comprises a bottom-electrode barrier layer 112, the bottom electrode 106, the bottom-electrode interface structure 104, the switching layer 108, and a top electrode 114 stacked over the bottom metal structure 110.

The bottom electrode 106, the bottom-electrode barrier layer 112, the top electrode 114, and the bottom metal structure 110 are conductive, and the bottom-electrode barrier layer 112 is dielectric. Further, to the extent that the memory cell 102 is a FeRAM cell, the switching layer 108 is ferroelectric. The bottom-electrode barrier layer 112 overlies the bottom metal structure 110, and the bottom electrode 106 overlies the bottom-electrode barrier layer 112, such that the bottom-electrode barrier layer 112 separates the bottom electrode 106 from the bottom metal structure 110. The bottom-electrode interface structure 104 overlies the bottom electrode 106, and the switching layer 108 overlies the bottom-electrode interface structure 104, such that the bottom-electrode interface structure 104 separates the bottom electrode 106 from the switching layer 108. The top electrode 114 overlies the switching layer 108.

The bottom-electrode interface structure 104 is dielectric and is a different material than the bottom electrode 106 and the switching layer 108. The bottom-electrode interface structure 104 is configured to block or otherwise resist material used during formation of the switching layer 108 from diffusing or otherwise migrating into the bottom electrode 106 and causing impurities in the bottom electrode 106. For example, the switching layer 108 may be formed by atomic layer deposition (ALD) or some other suitable deposition process using gaseous precursors. The bottom-electrode interface structure 104 may block or otherwise resist diffusion of the gaseous precursors into the bottom electrode 106 during the deposition process.

Absent the bottom-electrode interface structure 104, material used during formation of the switching layer 108 may diffuse into the bottom electrode 106 and may cause impurities in the bottom electrode 106. For example, chloride and/or oxide precursors may diffuse into the bottom electrode 106 and may cause impurities that comprise chlorine ions (e.g., Cl⁻) and/or oxygen ions (O⁻). Further, absent the bottom-electrode interface structure 104, the impurities may diffuse from the bottom electrode 106 to the switching layer 108 after formation of the switching layer 108. This may cause an increase in leakage current, which may degrade data retention and hence reliability of the memory cell 102. Accordingly, the bottom-electrode interface structure 104 may reduce leakage current by preventing impurities in the bottom electrode 106. This may enhance data retention and hence reliability of the memory cell 102. Further, by reducing leakage current, the breakdown voltage of the memory cell 102 may be increased.

In some embodiments, the bottom-electrode interface structure 104 is inert to material used during formation of the switching layer 108. By inert, it is meant that the bottom-electrode interface structure 104 does not react with the material and/or depends on more energy to react with the material than the bottom electrode 106. In embodiments in which the switching layer 108 is deposited by ALD, the inertness allows the precursors to fully or more completely react with each other. This, in turn, reduces the likelihood of unreactive precursors contaminating the switching layer 108 and hence increasing leakage current. Therefore, the bottom-electrode interface structure 104 may further reduce leakage current at the switching layer 108, which may enhance data retention and hence reliability of the memory cell 102.

In some embodiments, impurities enter the bottom electrode 106 during formation of the bottom electrode 106 and/or between formation of the bottom electrode 106 and the switching layer 108. The bottom-electrode interface structure 104 is further configured to block or otherwise resist diffusion of these impurities from the bottom electrode 106 to the switching layer 108 to further reduce leakage current. As above, by reducing leakage current, data retention and hence reliability of the memory cell 102 may be enhanced.

In some embodiments, the bottom-electrode barrier layer 112 comprises active metal atoms, and the bottom electrode 106 and/or the bottom-electrode interface structure 104 is/are configured to block or otherwise resist diffusion of the active metal atoms to the switching layer 108. As used herein, active metal atoms are metal atoms having a high diffusion coefficient. A high diffusion coefficient may, for example, be a diffusion coefficient in excess of about $10^{-13}$ squared centimeters per second ($cm^2s^{-1}$), $10^{-12}$ $cm^2s^{-1}$, $10^{-11}$ $cm^2s^{-1}$, or some other suitable amount. Non-limiting examples of active metal atoms include, for example, copper atoms, tantalum atoms, and the like. By blocking or otherwise resisting diffusion of the active metal atoms from the bottom-electrode barrier layer 112 to the switching layer 108, the bottom electrode 106 and/or the bottom-electrode interface structure 104 may reduce leakage current. By reducing leakage current, data retention and hence reliability of the memory cell 102 may be enhanced.

In some embodiments, the bottom electrode 106 comprises active metal atoms, and the bottom-electrode interface structure 104 is configured to block or otherwise resist diffusion of the active metal atoms to the switching layer 108. By blocking or otherwise resisting diffusion of the active metal atoms from the bottom electrode 106, the bottom-electrode interface structure 104 may reduce leakage current. By reducing leakage current, data retention of the memory cell 102 and hence reliability of the memory cell 102 may be enhanced.

In some embodiments, the bottom electrode 106 blocks or otherwise resists diffusion of active metal atoms from the bottom-electrode barrier layer 112 by: 1) being more amorphous and/or less crystalline than the bottom-electrode barrier layer 112; 2) having an average crystalline grain size larger or smaller than that of the bottom-electrode barrier layer 112; 3) having a different lattice constant than that of the bottom-electrode barrier layer 112; 4) being made up of atoms having larger and/or smaller atomic radii than the active metal atoms; or 5) any combination of the foregoing. For example, the bottom electrode 106 may be or comprise titanium nitride with an atomic percentage of nitrogen that is about 50% or some other suitable percent, whereas the bottom-electrode barrier layer 112 may be or comprise tantalum and/or tantalum nitride. Other suitable materials are, however, amenable.

Amorphousness and crystallinity as referenced throughout the present disclosure may, for example, be quantified by X-ray diffraction (XRD), electron backscatter diffraction (EBSD), differential scanning calorimetry (DSC), or any other suitable technique. Further, such quantification may, for example, be employed for relative comparisons between amorphousness and crystallinity, which are described throughout the present disclosure.

In some embodiments, the bottom-electrode interface structure 104 blocks or otherwise resists diffusion of active metal atoms and/or impurities from or to the bottom electrode 106 by: 1) being more amorphous and/or less crystalline than that of the bottom electrode 106; 2) having an average crystalline grain size larger or smaller than that of the bottom electrode 106; 3) having a different lattice constant than that of the bottom electrode 106; 4) being made up of atoms having larger and/or smaller atomic radii than the active metal atoms and/or the impurities; or 5) any combination of the foregoing. In some embodiments, the bottom-electrode interface structure 104 is amorphous, and the bottom electrode 106 is crystalline.

The bottom metal structure 110 is or comprises active metal atoms, and the bottom-electrode barrier layer 112 is configured to block or otherwise resist diffusion of the active metal atoms from the bottom metal structure 110 to the bottom electrode 106. In some embodiments, the bottom-electrode barrier layer 112 achieves this by: 1) being more amorphous and/or less crystalline than that of the bottom metal structure 110; 2) having an average crystalline grain size larger or smaller than that of the bottom metal structure 110; 3) having a different lattice constant than that of the bottom metal structure 110; 4) being made up of atoms having larger and/or smaller atomic radii than the active metal atoms; or 5) any combination of the foregoing.

In at least some embodiments in which the bottom-electrode barrier layer 112 comprises active metal atoms, the active metal atoms of the bottom metal structure 110 correspond to a different metal element than the active metal atoms of the bottom-electrode barrier layer 112. For example, the active metal atoms of the bottom metal structure 110 may correspond to copper, and the active metal atoms of the bottom-electrode barrier layer 112 may correspond to tantalum. Other suitable elements are, however, amenable. In some embodiments, the active metal atoms of the bottom-electrode barrier layer 112 have a first diffusion coefficient and the active metal atoms of the bottom metal structure 110 have a second, larger diffusion coefficient.

The switching layer 108 has a property used to represent a bit of data and configured to reversibly switch between a first state and a second state. For example, the first state may represent a binary "1", whereas the second state may present a binary "0", or vice versa. The property may, for example, correspond resistance, remanent polarization, some other suitable property, or any combination of foregoing.

In embodiments in which the memory cell 102 is an FeRAM cell, the switching layer 108 has a remanent polarization. A first state of the remanent polarization represents a binary "1", whereas a second state of the remanent polarization represents a binary "0", or vice versa. The remanent polarization may be set to the first state by applying a first voltage in excess of the coercive voltage from the top electrode 114 to the bottom electrode 106. Further, the remanent polarization may be set to the second state by applying a second voltage in excess of the coercive voltage, and having an opposite polarity as the first voltage, from the top electrode 114 to the bottom electrode 106. The state of the remanent polarization may be electrically determined by setting the remanent polarization to the first state. If the remanent polarization is in the second state, a current pulse is generated. Otherwise, no current pulse will be generated.

In some embodiments, the bottom electrode 106 is or comprises tantalum nitride, molybdenum, titanium nitride, tungsten nitride, iridium, ruthenium, or the like. In some embodiments, a thickness $T_{be}$ of the bottom electrode 106 is about 50-500 angstroms, about 50-275 angstroms, about 275-500 angstroms, or some other suitable value.

In some embodiments, the bottom electrode 106 is or comprises non-active metal atoms. Further, in some embodiments, the bottom electrode 106 consists essentially of non-active metal atoms and/or, amongst all metal atoms in the bottom electrode 106, the metal atoms consist essentially of non-active metal atoms. As used herein, non-active metal atoms are metal atoms having a low diffusion coefficient. A low diffusion coefficient may, for example, be a diffusion coefficient less than about $10^{-13}$ cm$^2$s$^{-1}$, $10^{-14}$ cm$^2$s$^{-1}$, or some other suitable amount.

In some embodiments, the bottom electrode 106 is or comprises active metal atoms. Further, in some embodiments, the bottom electrode 106 consists essentially of active metal atoms and/or, amongst all metal atoms in the bottom electrode 106, the metal atoms consist essentially of active metal atoms. Non-limiting examples of materials with active metal atoms include, for example, tantalum, copper, and the like.

In some embodiments, the bottom-electrode barrier layer 112 is or comprises tantalum, tantalum nitride, some other suitable material(s), or any combination of the foregoing. In some embodiments, the bottom-electrode barrier layer 112 is a single-layer film. In alternative embodiments, the bottom-electrode barrier layer 112 is a multilayer film. For example, the bottom-electrode barrier layer 112 may be a two-layer film comprising a tantalum nitride layer and a tantalum layer overlying the tantalum nitride layer. In some embodiments, the bottom metal structure 110 is or comprise copper, aluminum copper, tantalum, some other suitable material(s), or any combination of the foregoing.

In some embodiments, the switching layer 108 is a high k dielectric and/or is or comprises a metal oxide. In some embodiments, the switching layer 108 is or comprises a hafnium oxide-based film, a zirconium oxide-based film, or the like in the orthorhombic phase. For example, the switching layer 108 may be or comprise hafnium zirconium oxide (e.g., HfZrO or HZO), hafnium aluminum oxide (e.g., HfAlO), hafnium lanthanum oxide (e.g., HfLaO), hafnium cerium oxide (e.g., HfCeO), hafnium oxide (e.g., HfO), hafnium silicon oxide (e.g., HfSiO), hafnium gadolinium oxide (e.g., HfGdO), or the like. In some embodiments, the switching layer 108 is doped with dopants having an atomic percentage at or less than about 50%, 40%, 25%, or some other suitable percentage. The dopants may, for example, be or comprise aluminum (e.g., Al), silicon (e.g., Si), lanthanum (e.g., La), scandium (e.g., Sc), calcium (e.g., Ca), barium (e.g., Ba), gadolinium (e.g., Gd), yttrium (e.g., Y), strontium (e.g., Sr), some other suitable element(s), or any combination of the foregoing. In embodiments in which the memory cell 102 is a FeRAM cell and hence the switching layer 108 is ferroelectric, the switching layer 108 has a ratio of orthorhombic, tetragonal, and cubic phases to orthorhombic, tetragonal, cubic, and monoclinic phases that is greater than about 0.5 or some other suitable value.

In some embodiments, a thickness $T_{s1}$ of the switching layer 108 is about 20-500 angstroms, about 20-260 angstroms, about 260-500 angstroms, or some other suitable value. If the thickness $T_{s1}$ is too small (e.g., less than about 20 angstroms), crystallization of the switching layer 108 may be poor, whereby the switching layer 108 may have a low breakdown voltage. On the other hand, if the thickness $T_{s1}$ is too large (e.g., more than about 500 angstroms), operating voltages of the memory cell 102 may be high.

In some embodiments, the bottom-electrode interface structure 104 is or comprises a metal oxide, a metal nitride, a metal oxynitride, or the like. For example, the bottom-electrode interface structure 104 may be or comprise titanium oxide, titanium nitride, titanium oxynitride, tantalum oxide, tantalum nitride, tantalum oxynitride, or the like. In at least some embodiments in which the bottom electrode 106 is or comprises titanium nitride, the bottom-electrode interface structure 104 is or comprises titanium oxynitride or the like. In at least some embodiments in which the bottom electrode 106 is or comprises tantalum nitride, the bottom-electrode interface structure 104 is or comprises tantalum oxynitride or the like.

In some embodiments, the bottom-electrode interface structure 104 is or comprises an oxide or oxynitride of active metal atoms. In other embodiments, the bottom-electrode interface structure 104 is or comprises non-active metal atoms. Further, in some embodiments, the bottom-electrode interface structure 104 consists essentially of non-active metal atoms and/or, amongst all metal atoms in the bottom-electrode interface structure 104, the metal atoms consist essentially of non-active metal atoms. In some embodiments, the bottom-electrode interface structure 104 and the bottom electrode 106 share a common metal, which may be active or non-active. In some embodiments, a concentration of non-metal elements (e.g., nitrogen, oxygen, or the like) in the bottom-electrode interface structure 104 decreases from a top of the bottom-electrode interface structure 104 to a bottom of the bottom-electrode interface structure 104. The concentration may decrease continuously or discretely from the top to the bottom.

In some embodiments, the bottom-electrode interface structure 104 comprises or consists essentially of a metal element and a first non-metal element. In some embodiments, the metal element is shared with the bottom electrode 106, and the bottom electrode 106 is devoid of the first non-metal element. Further, in some embodiments, the bottom-electrode interface structure 104 further comprises a second non-metal element different than the first non-metal element. In some embodiments, the metal element and the second non-metal element are shared with the bottom electrode 106, and the bottom electrode 106 is devoid of the first non-metal element. The first non-metal element and the second non-metal element may, for example, each be oxygen, nitrogen, or some other suitable element.

In some embodiments, an interface at a bottom surface of the switching layer 108 has a lesser arithmetic average roughness than would exist if the bottom-electrode interface structure 104 was omitted. With the bottom-electrode interface structure 104, the interface is between the bottom-electrode interface structure 104 and the switching layer 108. Without the bottom-electrode interface structure 104, the interface is between the bottom electrode 106 and the switching layer 108. In some embodiments, the lesser arithmetic average roughness is about 3 angstroms, less than about 3 angstroms, about 2-3 angstroms, or some other suitable value. The arithmetic average roughness may, for example, be measured by atomic force microscopy (AFM) or the like. The lesser arithmetic average roughness may enhance electric field uniformity across the switching layer 108 and may hence enhance endurance.

In some embodiments, a thickness $T_{ifs}$ of the bottom-electrode interface structure 104 is about 20-200 angstroms, about 20-110 angstroms, about 110-200 angstroms, or some other suitable values. If the thickness $T_{ifs}$ is too small (e.g., less than about 20 angstroms), the bottom-electrode interface structure 104 may be unable to prevent diffusion of active metal atoms and/or impurities through the bottom-electrode interface structure 104. As such, the bottom-electrode interface structure 104 may be unable to reduce leakage current. If the thickness $T_{ifs}$ is too large (e.g., more than about 200 angstroms), processing challenges may arise.

In some embodiments, the top electrode 114 is or comprises tantalum nitride, molybdenum, titanium nitride, tungsten nitride, iridium, ruthenium, or the like. In some embodiments, the top electrode 114 is or comprises a same material as the bottom electrode 106. In other embodiments, the top electrode 114 is a different material than the bottom electrode 106. In some embodiments, the top electrode 114 is or comprises non-active metal atoms. Further, in some embodiments, the top electrode 114 consists essentially of non-active metal atoms and/or, amongst all metal atoms in the top electrode 114, the metal atoms consist essentially of non-active metal atoms. In some embodiments, the top electrode 114 is or comprises a nitride of active metal atoms. In some embodiments, a thickness of the top electrode 114 is about 50-500 angstroms, about 50-275 angstroms, about 275-500 angstroms, or some other suitable value.

Figure 2A:
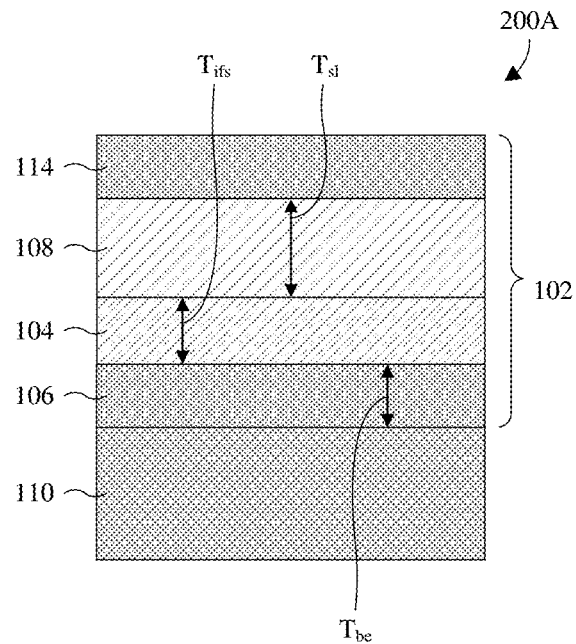
FIGS. 2A-2C illustrate cross-sectional views of some alternative embodiments of the memory cell of FIG. 1.
Figure 2B:
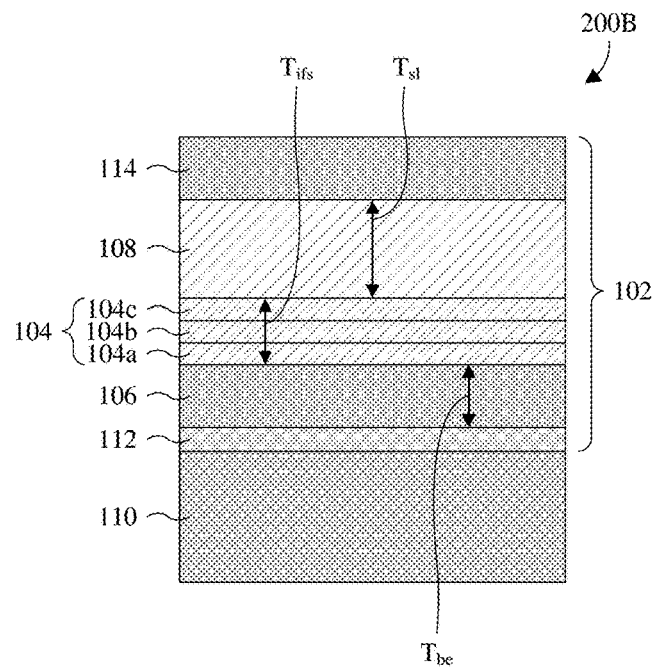
Figure 2C:
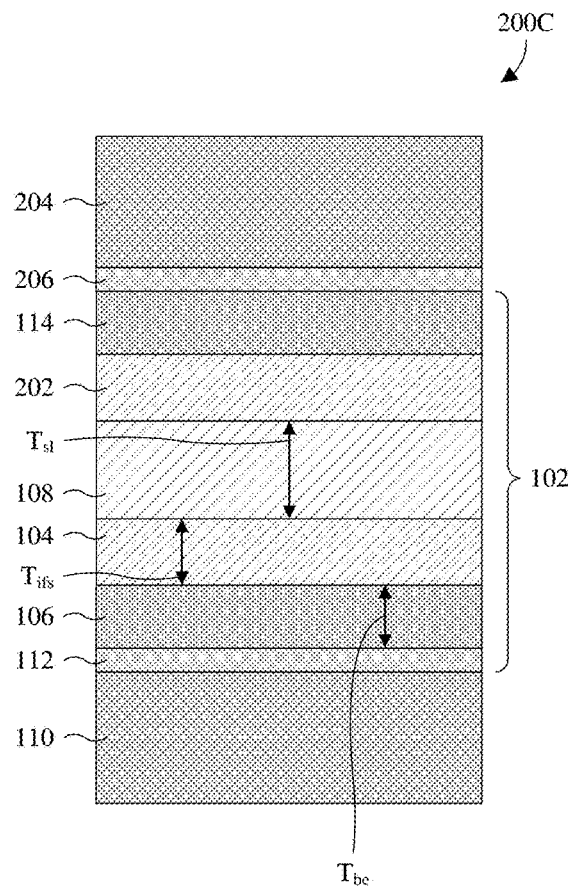

With reference to FIGS. 2A-2C, cross-sectional views 200A-200C of some alternative embodiments of the memory cell 102 of FIG. 1 is provided.

In FIG. 2A, the bottom-electrode barrier layer 112 is omitted and the bottom electrode 106 directly contacts the bottom metal structure 110. As such, the bottom electrode 106 and/or the bottom-electrode interface structure 104 is/are configured to block or otherwise resist diffusion of the active metal atoms of the bottom metal structure 110 to the switching layer 108. By blocking or otherwise resisting diffusion of the active metal atoms to the switching layer 108, the bottom electrode 106 and/or the bottom-electrode interface structure 104 may reduce leakage current. By reducing leakage current, data retention and hence reliability of the memory cell 102 may be enhanced. Further, breakdown voltage may be increased.

In some embodiments, the bottom electrode 106 blocks or otherwise resists diffusion of the active metal atoms by: 1) being more amorphous and/or less crystalline than that of the bottom metal structure 110; 2) having an average crystalline grain size larger or smaller than that of the bottom metal structure 110; 3) having a different lattice constant than that of the bottom metal structure 110; 4) being made up of atoms having larger and/or smaller atomic radii than the active metal atoms; or 5) any combination of the foregoing. For example, the bottom electrode 106 may be or comprise titanium nitride with an atomic percentage of nitrogen that is about 50% or some other suitable percent, whereas the bottom metal structure 110 may be or comprise copper and/or aluminum copper. Other suitable materials are, however, amenable. In some embodiments, the bottom-electrode interface structure 104 blocks or otherwise resists diffusion of the active metal atoms of the bottom metal structure 110 by: 1) being more amorphous and/or less crystalline than that of the bottom electrode 106; 2) having an average crystalline grain size larger or smaller than that of the bottom electrode 106; 3) having a different lattice constant than that of the bottom electrode 106; 4) being made up of atoms having larger and/or smaller atomic radii than the active metal atoms and/or the impurities; or 5) any combination of the foregoing.

In FIG. 2B, the bottom-electrode interface structure 104 comprises a plurality of interface layers 104a-104c stacked between the bottom electrode 106 and the switching layer 108. In alternative embodiments, the bottom-electrode interface structure 104 comprises additional interface layers. Further, in alternative embodiments, one or more of the interface layers 104a-104c is/are omitted. The interface layers 104a-104c are each individually as the bottom-electrode interface structure 104 is described with regard to FIG. 1.

In some embodiments, the interface layers 104a-104c are, comprise, or consist essentially of a common of set of elements, including one or more metal elements and one or more non-metal elements. The one or more non-metal elements may, for example, include oxygen, nitrogen, the like, or any combination of the foregoing. In at least some of such embodiments, the interface layers 104a-104c have different atomic percentages of the non-metal element(s) and further have different atomic percentages of the metal element(s). For example, a first interface layer 104a may have a first atomic percentage of the non-metal element(s), a second interface layer 104b may have a second atomic percentage of the non-metal element(s), and a third interface layer 104c may have a third atomic percentage of the non-metal element(s), wherein the first, second, and third atomic percentages are different. In some embodiments, the atomic percentages of the non-metal element(s) decrease discretely from the switching layer 108 to the bottom electrode 106. For example, continuing with the preceding example, the first atomic percentage may be less than the second atomic percentage, which may be less than the third atomic percentage.

In some embodiments, the interface layers 104a-104c are or comprise titanium oxide or nitride and have individual atomic percentages of oxygen or nitride that decrease discretely from the switching layer 108 to the bottom electrode 106. In some embodiments, the interface layers 104a-104c are or comprise titanium oxynitride and have individual atomic percentages of oxynitride that decrease discretely from the switching layer 108 to the bottom electrode 106.

In FIG. 2C, a top-electrode interface structure 202 separates the switching layer 108 from the top electrode 114. Further, a top metal structure 204 and a top-electrode barrier layer 206 are stacked over the top electrode 114, and the top-electrode barrier layer 206 separates the top metal structure 204 from the top electrode 114. In alternative embodiments, the top-electrode barrier layer 206 is omitted and the top metal structure 204 directly contacts the top electrode 114.

The top-electrode interface structure 202 is as the bottom-electrode interface structure 104 is described with regard to FIG. 1, except that that top-electrode interface structure 202 blocks or resists diffusion of impurities and/or active metal atoms from above the top-electrode interface structure 202 to the switching layer 108. Such impurities and/or active metal atoms may, for example, originate from the top electrode 114, the top metal structure 204, the top-electrode barrier layer 206, or any combination of the foregoing. In alternative embodiments, the bottom-electrode interface structure 104 comprises a plurality of interface layers 104a-104c as described with regard to FIG. 2B and/or the top-electrode interface structure 202 comprises a plurality of interface layers as described for the bottom-electrode interface structure 104 with regard to FIG. 2B.

The top electrode 114 may, for example, be as the bottom electrode 106 is described with regard to FIG. 1. The top metal structure 204 may, for example, be as the bottom metal structure 110 is described with regard to FIG. 1. The top-electrode barrier layer 206 may, for example, be as the bottom-electrode barrier layer 112 is described with regard to FIG. 1.

While FIG. 2A describes a variation to FIG. 1 in which the bottom-electrode barrier layer 112 is omitted, the variation may be applied to any of FIGS. 2B and 2C. Hence, the bottom-electrode barrier layer 112 may, for example, be omitted from FIG. 2B and/or FIG. 2C. While FIG. 2B describes a variation to FIG. 1 in which the bottom-electrode interface structure 104 comprises a plurality of interface layers 104a-104c, the variation may be applied to any of FIGS. 2A and 2C. Hence, the bottom-electrode barrier layer 112 may, for example, comprise a plurality of interface layers 104a-104c in FIG. 2A and/or FIG. 2B. While FIG. 2C describes a variation to FIG. 1 in which a top-electrode interface structure 202 separates the top electrode 114 from the switching layer 108, the variation may be applied to any of FIGS. 2A and 2B. Hence, the top-electrode interface structure 202 may be separate the top electrode 114 from the switching layer 108 in FIGS. 2A and/or 2B. While FIG. 2C describes a top metal structure 204 and a top-electrode barrier layer 206 stacked over the top electrode 114, the top metal structure 204 and the top-electrode barrier layer 206 may be stacked over the top electrode 114 in some embodiments of FIGS. 1, 2A, and 2B.

Figure 3:
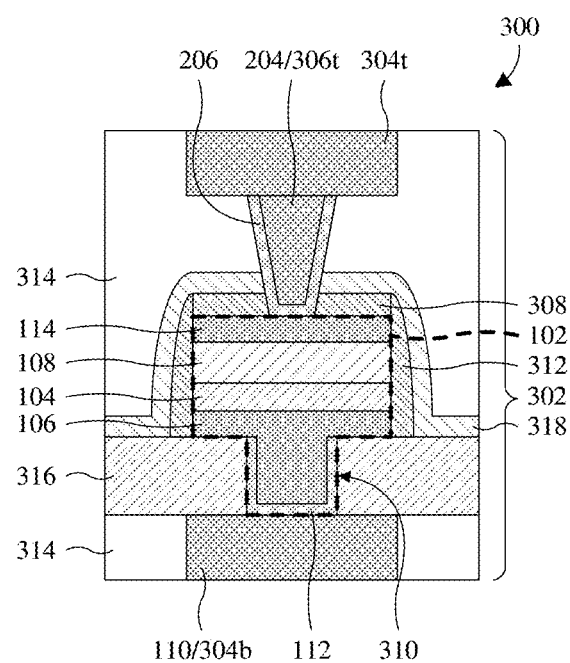
FIG. 3 illustrates an expanded cross-sectional view of some embodiments of the memory cell of FIG. 1 in which the memory cell is in an interconnect structure of an integrated circuit (IC) chip.

With reference to FIG. 3, a cross-sectional view 300 of some embodiments of the memory cell 102 of FIG. 1 is provided in which the memory cell 102 is in an interconnect structure 302 of an IC chip, vertically between a bottom-electrode wire 304b and a top-electrode wire 304t. Note that the bottom-electrode wire 304b may, for example, correspond to the bottom metal structure 110 described with regard to FIGS. 1 and 2A-2C.

A top-electrode via 306t extends downward from the top-electrode wire 304t towards the top electrode 114, and a top-electrode barrier layer 206 wraps around a bottom of the top-electrode via 306t to separate the top-electrode via 306t from the top electrode 114. Note that the top-electrode via 306t may, for example, correspond to the top metal structure 204 described with regard to FIG. 2C and/or the top-electrode barrier layer 206 may, for example, correspond to its counterpart described with regard to FIG. 2C. Further, the top-electrode via 306t and the top-electrode barrier layer 206 extend through a hard mask 308 atop the top electrode 114. In alternative embodiments, the hard mask 308 is omitted.

In some embodiments, the hard mask 308 is or comprise silicon nitride and/or some other suitable dielectric(s). In some embodiments, the top-electrode wire 304t, the bottom-electrode wire 304b, and the top-electrode via 306t are or comprise, for example, copper, aluminum copper, some other suitable metal(s), or any combination of the foregoing.

The bottom electrode 106 has a T-shaped profile and protrudes downward towards the bottom-electrode wire 304b, thereby forming a bottom-electrode via 310. Further, the bottom-electrode barrier layer 112 wraps around the bottom-electrode via 310 to separate the bottom-electrode via 310 and hence the bottom electrode 106 from the bottom-electrode wire 304b. In alternative embodiments, the bottom-electrode barrier layer 112 is omitted, such that the bottom-electrode via 310 directly contacts the bottom-electrode wire 304b.

The bottom electrode 106, the bottom-electrode interface structure 104, the switching layer 108, the top electrode 114, and the hard mask 308 share a common width. In alternative embodiments, widths vary. The bottom electrode 106, the bottom-electrode interface structure 104, the switching layer 108, the top electrode 114, and the hard mask 308 form common sidewalls respectively on opposite sides of the memory cell 102. The common sidewalls have a planar profile but may have curved or other suitable profiles in alternative embodiments. Further, the common sidewalls are lined by a sidewall spacer structure 312. The sidewall spacer structure 312 has a plurality of spacer segments individual to and respectively lining the common sidewalls from top to bottom. In some embodiments, the sidewall spacer structure 312 is or comprises silicon nitride and/or some other suitable dielectric(s). Further, in some embodiments, the sidewall spacer structure 312 is a same material as the hard mask 308.

A plurality of intermetal dielectric (IMD) layers 314 respectively surround the bottom-electrode wire 304b and the top-electrode wire 304t, and a via dielectric layer 316 separates the IMD layers 314 and surrounds the bottom-electrode via 310. Further, an etch stop layer 318 covers the via dielectric layer 316 and the memory cell 102 and separates an upper one of the IMD layers 314 from the via dielectric layer 316 and the memory cell 102.

In some embodiments, the IMD layers 314 are or comprises an extreme low k dielectric and/or some other suitable dielectric(s). In some embodiments, the via dielectric layer 316 is or comprises silicon carbide and/or some other suitable dielectric(s). In some embodiments, the etch stop layer 318 is or comprises silicon carbide, tetraethyl orthosilicate (TEOS) oxide, some other suitable dielectric(s), or any combination of the foregoing.

With reference to FIGS. 4A-4E, cross-sectional views 400A-400F of some alternative embodiments of the memory cell 102 of FIG. 3 is provided.

Figure 4A:
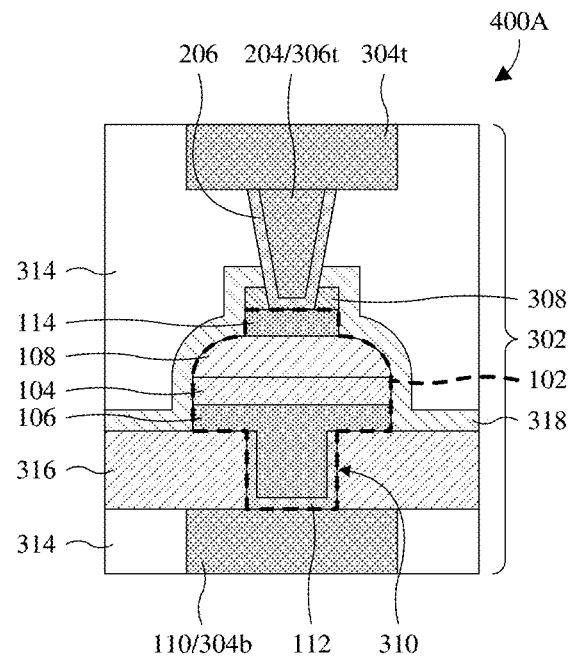
FIGS. 4A-4E illustrate cross-sectional views of some alternative embodiments of the memory cell of FIG. 3.

In FIG. 4A, the sidewall spacer structure 312 is omitted. Further, the bottom electrode 106 and the bottom-electrode interface structure 104 share a first width, whereas the top electrode 114 and the hard mask 308 share a second width less than the first width. In alternative embodiments, widths vary amongst the bottom electrode 106 and the bottom-electrode interface structure 104 and/or amongst the top electrode 114 and the hard mask 308.

The bottom electrode 106 and the bottom-electrode interface structure 104 form first common sidewalls respectively on opposite sides of the memory cell 102, whereas the top electrode 114 and the hard mask 308 form second common sidewalls respectively on the opposite sides. The first and second common sidewalls have planar profiles, but curved or other suitable profiles are amenable. The switching layer 108 has sidewalls respectively on the opposite sides of the memory cell 102 that arc inward towards each other respectively from the first common sidewalls respectively to the second common sidewalls. As such, a width of the switching layer 108 decreases from the bottom-electrode interface structure 104 to the top electrode 114.

Figure 4B:
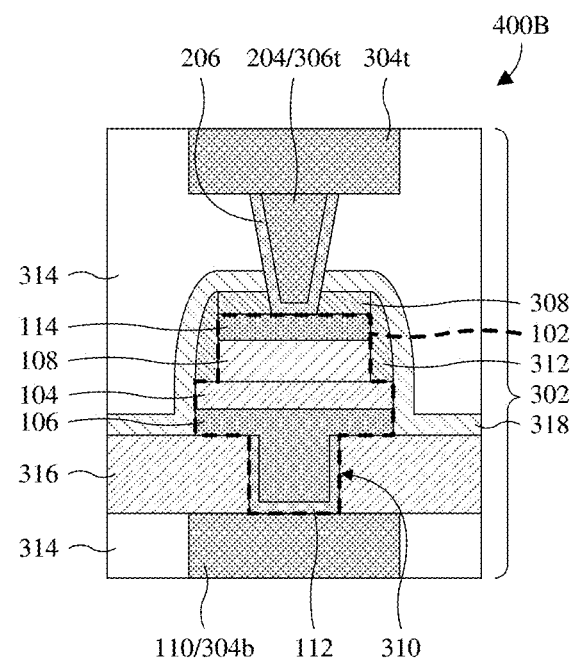

In FIG. 4B, the bottom electrode 106 and the bottom-electrode interface structure 104 share a first width, whereas the switching layer 108, the top electrode 114, and the hard mask 308 share a second, lesser width. In alternative embodiments, widths vary amongst the bottom electrode 106 and the bottom-electrode interface structure 104 and/or amongst the switching layer 108, the top electrode 114, and the hard mask 308. Further, the bottom electrode 106 and the bottom-electrode interface structure 104 form first common sidewalls respectively on opposite sides of the memory cell 102, whereas the switching layer 108, the top electrode 114, and the hard mask 308 form second common sidewalls respectively on the opposite sides. The first and second common sidewalls have planar profiles, but curved or other suitable profiles are amenable.

The sidewall spacer structure 312 overlies the bottom-electrode interface structure 104, laterally between the first common sidewalls. Further, the sidewall spacer structure 312 lines the second common sidewalls. Particularly, the spacer segments are individual to and respectively line the second common sidewalls from top to bottom.

Figure 4C:
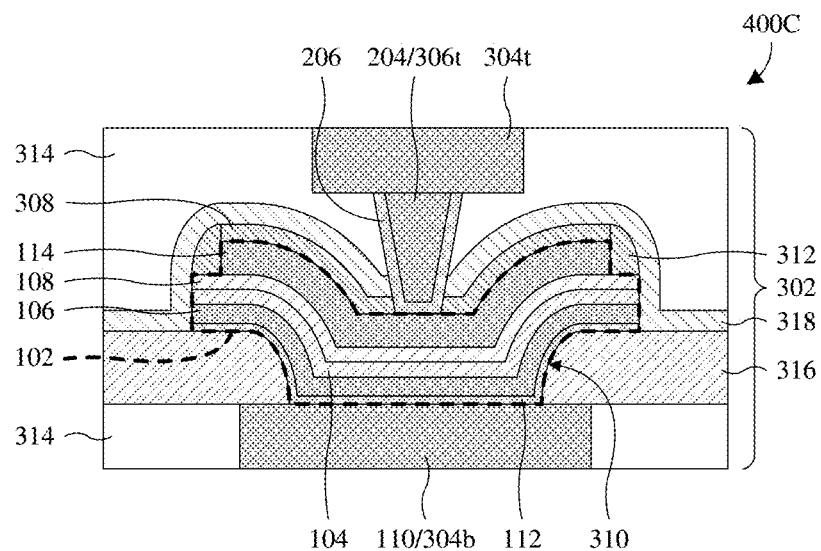

In FIG. 4C, the bottom-electrode barrier layer 112, the bottom electrode 106, the bottom-electrode interface structure 104, the switching layer 108, the top electrode 114, and the hard mask 308 are indented at the bottom-electrode via 310.

The bottom-electrode barrier layer 112, the bottom electrode 106, the bottom-electrode interface structure 104, and the switching layer 108 share a first width, whereas the top electrode 114 and the hard mask 308 share a second, lesser width. In alternative embodiments, widths vary amongst the bottom-electrode barrier layer 112, the bottom electrode 106, the bottom-electrode interface structure 104, and the switching layer 108 and/or amongst the top electrode 114 and the hard mask 308. The bottom-electrode barrier layer 112, the bottom electrode 106, the bottom-electrode interface structure 104, and the switching layer 108 form first common sidewalls respectively on opposite sides of the memory cell 102, whereas the top electrode 114 and the hard mask 308 form second common sidewalls respectively on the opposite sides. The first and second common sidewalls have planar profiles, but curved or other suitable profiles are amenable.

The sidewall spacer structure 312 overlies the switching layer 108, laterally between the first common sidewalls. Further, the sidewall spacer structure 312 lines the second common sidewalls. Particularly, the spacer segments are individual to and respectively line the second common sidewalls from top to bottom.

Figure 4D:
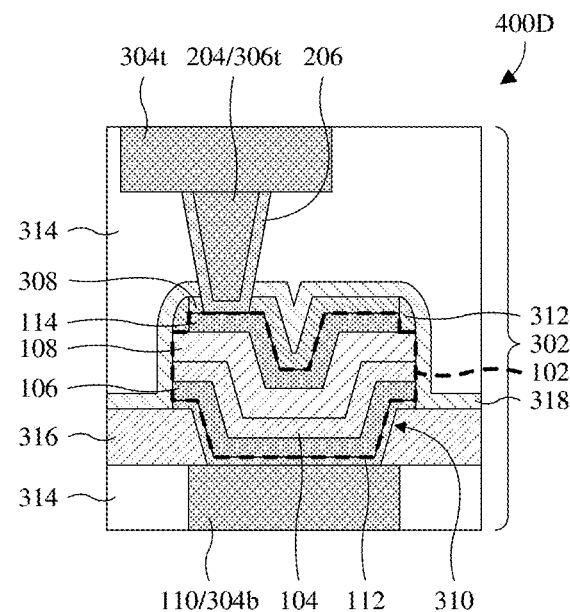

In FIG. 4D, the memory cell 102 is as described in FIG. 4C, except that the memory cell 102 is more rectilinear and constituents of the memory cell 102 have different proportions. Further, the top-electrode via 306t is shifted to a side of the memory cell 102 instead of being at a width-wise center of the memory cell 102.

Figure 4E:
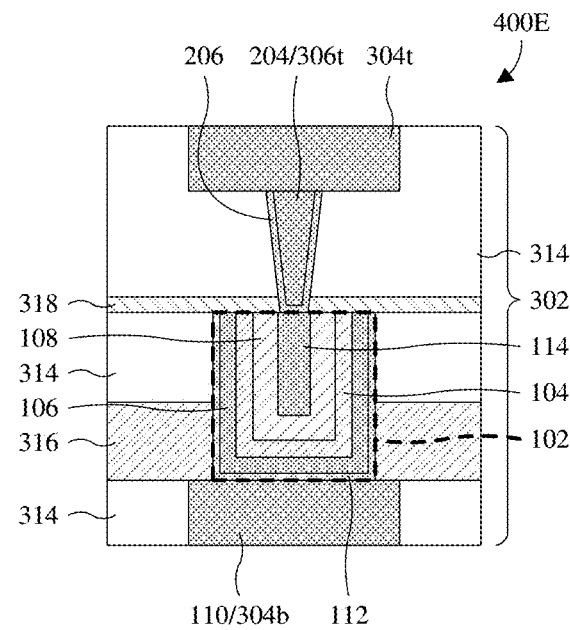

In FIG. 4E, the bottom-electrode via 310, the hard mask 308, and the sidewall spacer structure 312 are omitted, and the bottom-electrode barrier layer 112, the bottom electrode 106, the bottom-electrode interface structure 104, and the switching layer 108 have U-shaped profiles wrapping around a bottom of the top electrode 114. Further, the bottom-electrode barrier layer 112, the bottom electrode 106, the bottom-electrode interface structure 104, the switching layer 108, and the top electrode 114 are covered by the etch stop layer 318 and have individual top surfaces that are level with each other.

While FIGS. 3 and 4A-4E are illustrated using embodiments of the memory cell 102 in FIG. 1, FIGS. 3 and 4A-4E may alternatively use any of the embodiments in FIGS. 2A-2C. For example, the bottom-electrode barrier layer 112 may be omitted from any of FIGS. 3 and 4A-4E as illustrated and described with regard to FIG. 2A.

Figure 5A:
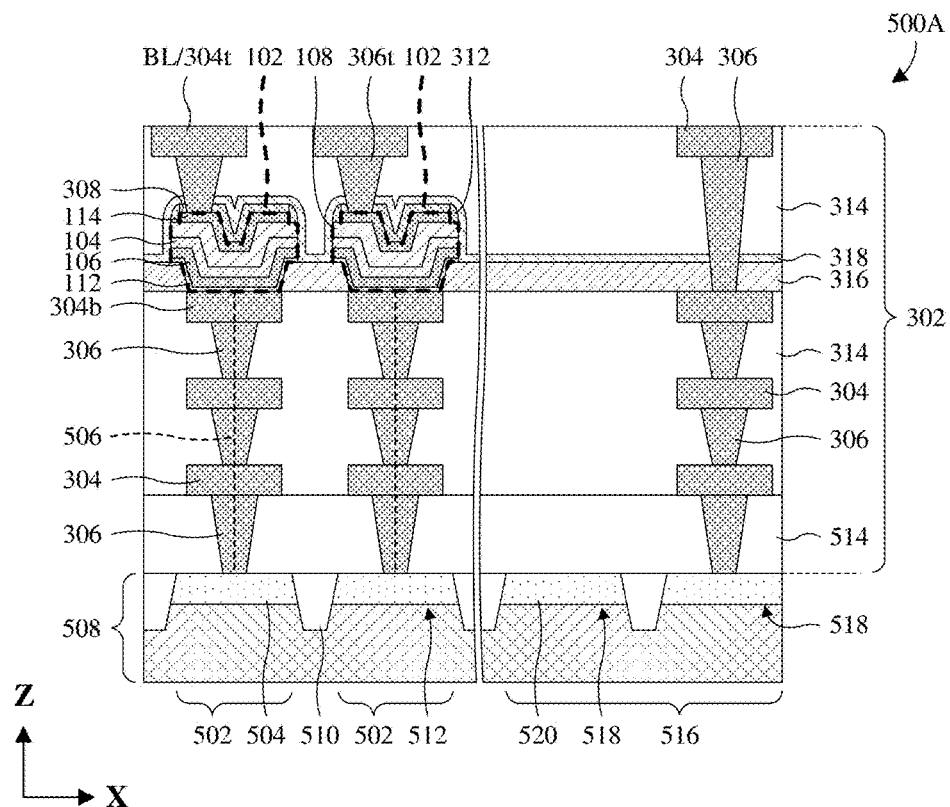
FIGS. 5A and 5B illustrate cross-sectional views of some embodiments of an IC chip in which memory cells are integrated with individual one-transistor one-resistor (1T1R) cells and comprise individual bottom-electrode interface structures.

With reference to FIG. 5A, a cross-sectional view 500A of some embodiments of memory cells 102 is provided in which the memory cells 102 comprise individual bottom-electrode interface structures 104 and are integrated into individual one-transistor one-resistor (1T1R) cells 502 in an IC chip. Each of the memory cells 102 of FIG. 5A is as the memory cell 102 of FIG. 4D is illustrated and described. The 1T1R cells 502 comprise individual drain regions 504 and individual drain-side conductive paths 506.

The drain regions 504 are doped regions of a substrate 508 and each has an opposite doping type as an adjoining region of the substrate 508. Further, the drain regions 504 are electrically separated from each other by a trench isolation structure 510 and partially define access transistors 512 (partially shown) used to individually select the memory cells 102. The trench isolation structure 510 extends into a top of the substrate 508 and comprises silicon oxide and/or some other suitable dielectric material(s). The trench isolation structure 510 may, for example, be a shallow trench isolation (STI) structure or some other suitable trench isolation structure. The substrate 508 may, for example, be a bulk silicon substrate, a silicon-on-insulator (SOI) substrate, or some other suitable semiconductor substrate.

The drain-side conductive paths 506 electrically couple the drain regions 504 to the memory cells 102. Further, the drain-side conductive paths 506 are formed by the interconnect structure 302, which comprises a plurality of wires 304 and a plurality of vias 306. The plurality of wires 304 comprises top-electrode wires 304t and bottom-electrode wires 304b. In some embodiments, the top-electrode wires 304t correspond to bit lines BL. The plurality of vias 306 comprises top-electrode vias 306t. A level of the vias 306 nearest the substrate 508 is in an interlayer dielectric (ILD) layer 514, whereas remaining levels of the vias 306 and the wires 304 are in IMD layers 314. The wires 304 and the vias 306 may be or comprise, for example, copper, some other suitable conductive material(s), or any combination of the foregoing.

A peripheral region 516 to a side of the 1T1R cells 502 accommodates peripheral devices 518 (only partially shown). The peripheral devices 518 may, for example, be metal-oxide-semiconductor field-effect transistors (MOSFETs), fin field-effect transistors (finFETs), gate-all-around field-effect transistors (GAA FETs), or some other suitable type of semiconductor device. Each of the peripheral devices 518 comprises a pair of source/drain regions 520 (only one of which is shown) in the substrate 508 and a gate structure (not shown) between the source/drain regions 520. The source/drain regions 520 are doped regions of the substrate 508 and each has an opposite doping type as an adjoining region of the substrate 508.

Figure 5B:
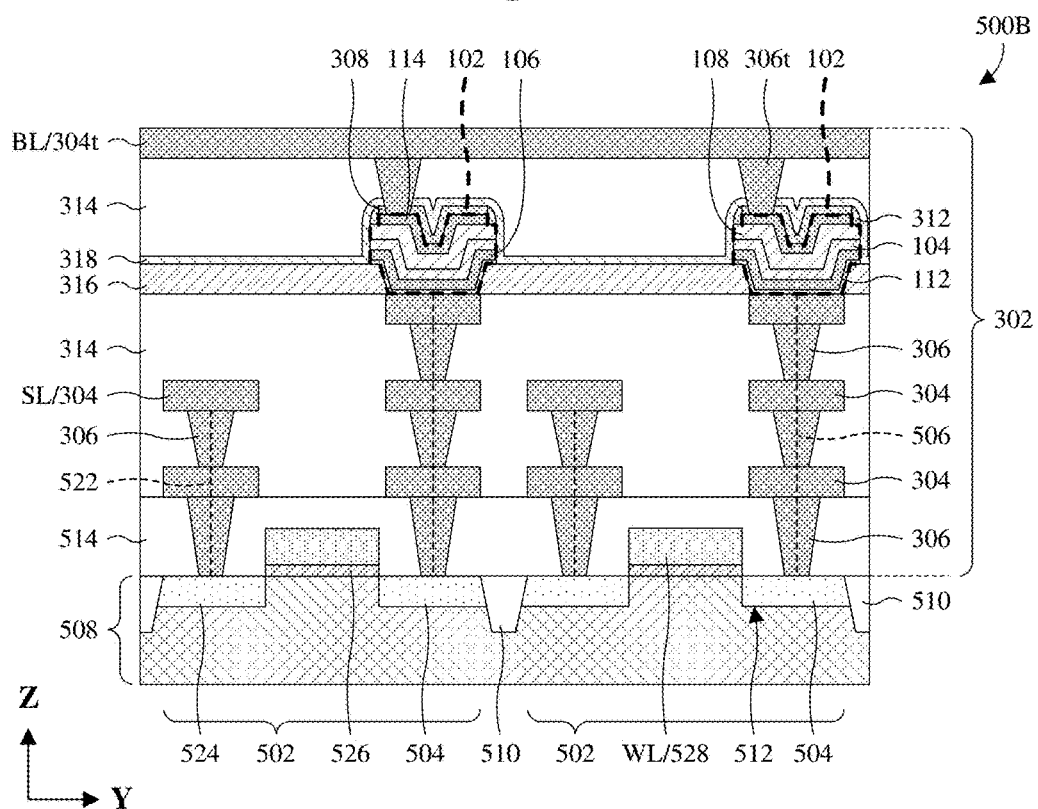

With reference to FIG. 5B, a cross-sectional view 500B of some embodiments of the IC chip of FIG. 5A is provided along an axis orthogonal to an axis along which the cross-sectional view 500A of FIG. 5A is taken. The 1T1R cells 502 comprise individual memory cells 102, individual drain-side conductive paths 506, individual access transistors 512, and individual source-side conductive paths 522. The memory cells 102 of FIG. 5B are each as the memory cell 102 of FIG. 4D is illustrated and described.

The access transistors 512 are on the substrate 508, between the substrate 508 and the interconnect structure 302, and are electrically separated by the trench isolation structure 510. The access transistors 512 comprise individual drain regions 504, individual source regions 524, individual gate dielectric layers 526, and individual gate electrodes 528. The gate electrodes 528 respectively overlie the gate dielectric layers 526 and, in some embodiments, form word lines WL. The drain and source regions 504, 524 are doped regions of the substrate 508 and each has an opposite doping type as an adjoining region of the substrate 508. The drain regions 504 respectively border drain sides of the gate electrodes 528, and the source regions 524 respectively border source sides of the gate electrodes 528. The access transistors 512 may, for example, be MOSFETs, finFETs, GAA FETs, or some other suitable type of semiconductor device.

The drain-side conductive paths 506 electrically couple the drain regions 504 to the memory cells 102, and the source-side conductive paths 522 electrically couple the source regions 524 to source lines SL. The drain-side and source-side conductive paths 506, 522 are formed by the plurality of wires 304 and the plurality of vias 306 in the interconnect structure 302.

Figure 6:
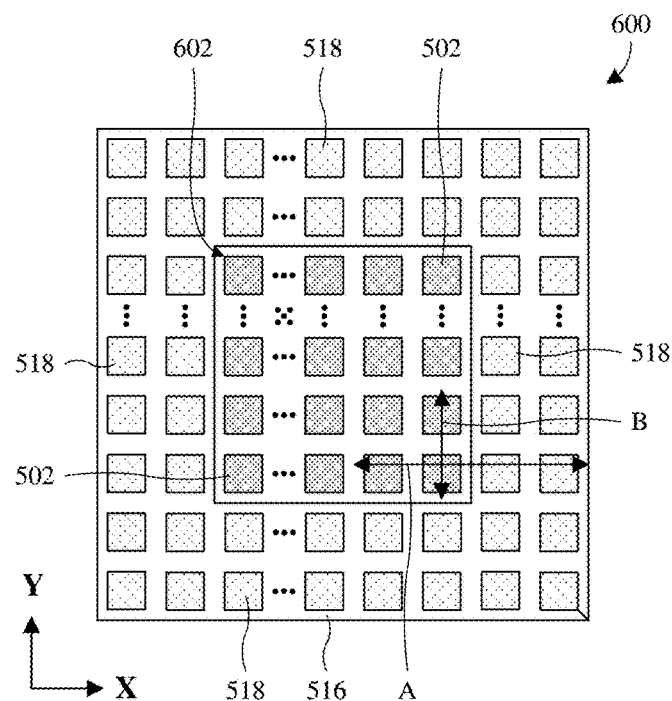
FIG. 6 illustrates a top layout of some embodiments of the IC chip of FIGS. 5A and 5B.

With reference to FIG. 6, a top layout 600 of some embodiments of the IC chip of FIGS. 5A and 5B is provided. The cross-sectional views 500A, 500B of FIGS. 5A and 5B may, for example, respectively be taken along lines A and B or other suitable locations. The IC chip comprises a plurality of 1T1R cells 502 in a plurality of rows and a plurality of columns, thereby forming a memory array 602. Peripheral devices 518 surround the memory array 602 at a peripheral region 516 of the IC chip. The peripheral devices 518 may, for example, implement read/write circuitry and/or other suitable circuitry for operating the 1T1R cells 502.

In some embodiments, the memory array 602 has a NOR memory architecture. As such, the 1T1R cells 502 for any given column share a common bit line (see, e.g., the bit lines BL of FIGS. 5A and 5B) and a common source line (see, e.g., the source lines SL of FIG. 5B) and are electrically coupled in parallel from the common bit line to the common source line. FIGS. 5A and 5B may, for example, correspond to this memory architecture. In alternative embodiments, the memory array 602 has a NAND memory architecture. As such, the 1T1R cells 502 for any given column share a common bit line (see, e.g., the bit lines BL of FIGS. 5A and 5B) and a common source line (see, e.g., the source lines SL of FIG. 5B), but are electrically coupled in series from the common bit line to the common source line. The layout of wires 304 and vias 306 in FIGS. 5A and 5B may, for example, be different in this memory architecture.

While FIGS. 5A and 5B are illustrated using memory-cell embodiments in FIG. 4D, memory-cell embodiments in any one or combination of FIGS. 1, 2A-2C, 3, 4A-4C, and 4E may alternatively be used in FIGS. 5A and 5B. For example, memory-cell embodiments in FIG. 4E may alternatively be used in FIGS. 5A and 5B. As another example, memory-cell embodiments in FIG. 2A may alternatively be used, such that the bottom-electrode barrier layers 112 may be omitted in FIGS. 5A and 5B. As yet another example, one of the memory cells 102 in FIG. 5A may be as in FIG. 4D, whereas another one of the memory cells 102 in FIG. 5A may be as in FIG. 3.

Figure 7:
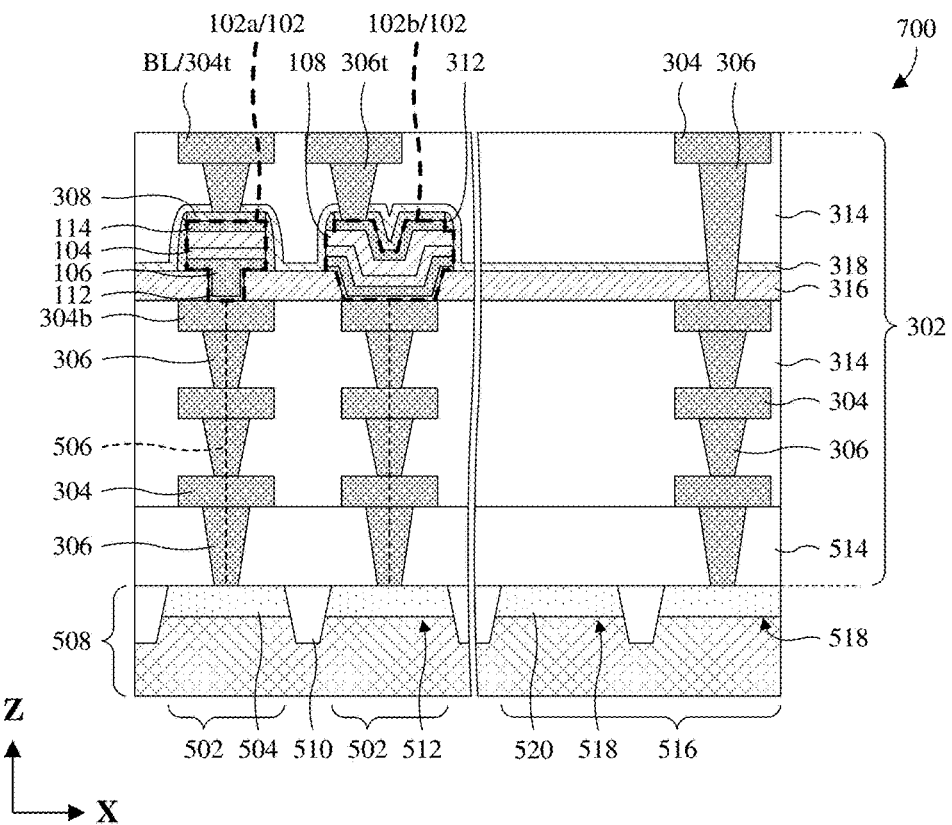
FIG. 7 illustrates a cross-sectional view of some alternative embodiments of the IC chip of FIG. 5A in which the memory cells have different layouts.

With reference to FIG. 7, a cross-sectional view 700 of some alternative embodiments of the IC chip of FIG. 5A is provided in which the memory cells 102 have different layouts. A first memory cell 102a is configured as in FIG. 3, whereas a second memory cell 102b is configured as in FIG. 4D. In alternative embodiments, the first memory cell 102a is configured as in any one or combination of FIGS. 1, 2A-2C, 4A-4C, and 4E, and/or the second memory cell 102b is configured as in any one or combination of FIGS. 1, 2A-2C, 4A-4C, and 4E.

With reference to FIGS. 8-19, a series of cross-sectional views 800-1900 of some embodiments of a method for forming memory cells is provided in which the memory cells comprise individual bottom-electrode interface structures and are integrated into 1T1R cells in an IC chip. The cross-sectional views 800-1900 may, for example, correspond to FIG. 5A and hence may, for example, illustrate formation of the IC chip of FIGS. 5A and 5B. Further, the cross-sectional views 800-1900 may, for example, be taken along line A in FIG. 6.

Figure 8:
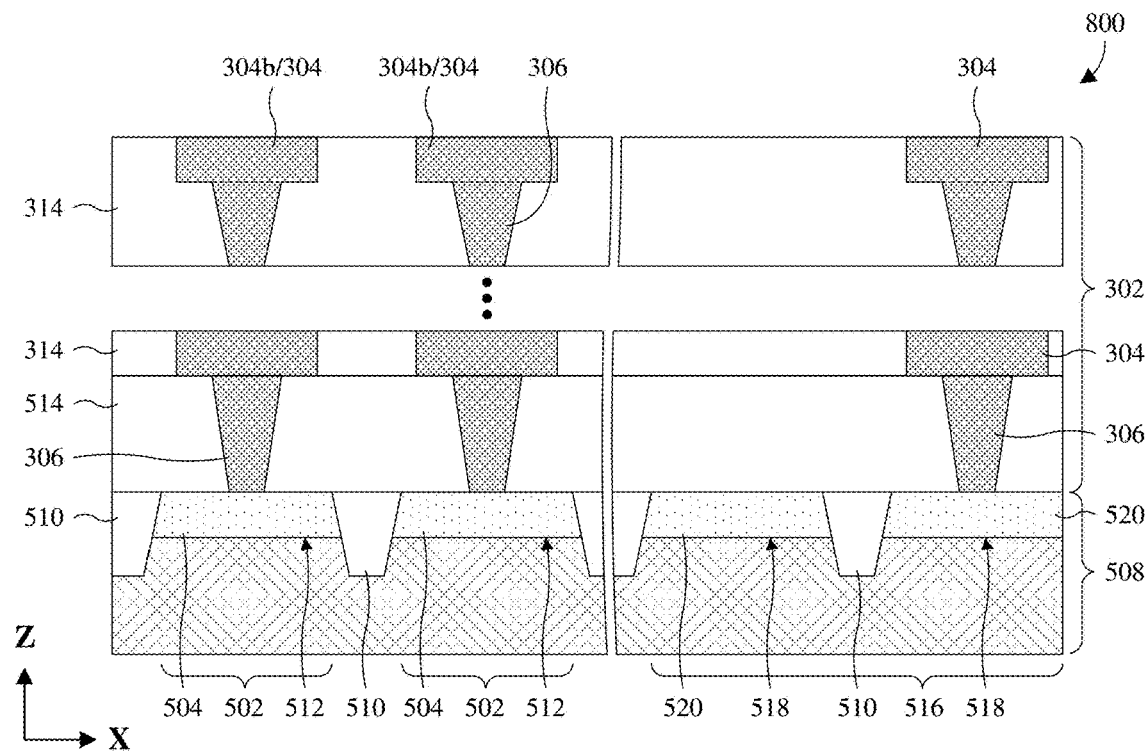
FIGS. 8-19 illustrate a series of cross-sectional views of some embodiments of a method for forming memory cells integrated with 1T1R cells and comprising bottom-electrode interface structures.

As illustrated by the cross-sectional view 800 of FIG. 8, a trench isolation structure 510 is formed extending into a top of a substrate 508. The trench isolation structure 510 individually surrounds and demarcates regions of the substrate 508 at which 1T1R cells 502 are being formed and further surrounds and demarcates a peripheral region 516 of the IC chip.

Also illustrated by the cross-sectional view 800 of FIG. 8, a plurality of semiconductor devices is formed on the substrate 508. The plurality of semiconductor devices comprises access transistors 512 individual to and respectively at the 1T1R cells 502 being formed. Further, the plurality of semiconductor devices comprise peripheral devices 518 at the peripheral region 516 of the IC chip. The access transistors 512 comprise individual drain regions 504 and individual source regions (not shown) in the substrate 508. Further, the access transistors 512 comprise individual gate structures (not shown). The gate structures have individual drain sides respectively bordering the drain regions 504 and further have individual source sides respectively bordering the source regions. The peripheral devices 518 comprise individual pairs of source/drain regions 520 (only one of which is shown from each pair) in the substrate 508 and further comprises individual gate structures (not shown) between and bordering the source/drain regions 520.

Also illustrated by the cross-sectional view 800 of FIG. 8, an interconnect structure 302 is partially formed over and electrically coupled to the semiconductor devices (e.g., the access transistor 512 and the peripheral devices 518). The interconnect structure 302 comprises a dielectric structure, and further comprises a plurality of wires 304 and a plurality of vias 306 stacked in the dielectric structure. The dielectric structure comprises an ILD layer 514 and a plurality of IMD layers 314 over the ILD layer 514. The plurality of wires 304 comprises a plurality of bottom-electrode wires 304b along a top surface of the interconnect structure 302. The bottom-electrode wires 304b are individual to and respectively at the 1T1R cells 502 being formed. Further, the bottom-electrode wires 304b are respectively electrically coupled to the drain regions 504 of the access transistor 512 by underlying wires and vias.

The wires 304, including the bottom-electrode wires 304b, comprise active metal atoms. As used herein, active metal atoms are metal atoms having a high diffusion coefficient. A high diffusion coefficient may, for example, be a diffusion coefficient in excess of about $10^{-13}$ cm$^2$s$^{-1}$, $10^{-12}$ cm$^2$s$^{-1}$, $10^{-11}$ cm$^2$s$^{-1}$, or some other suitable amount. Non-limiting examples of active metal atoms include copper atoms, tantalum atoms, and the like.

Figure 9:
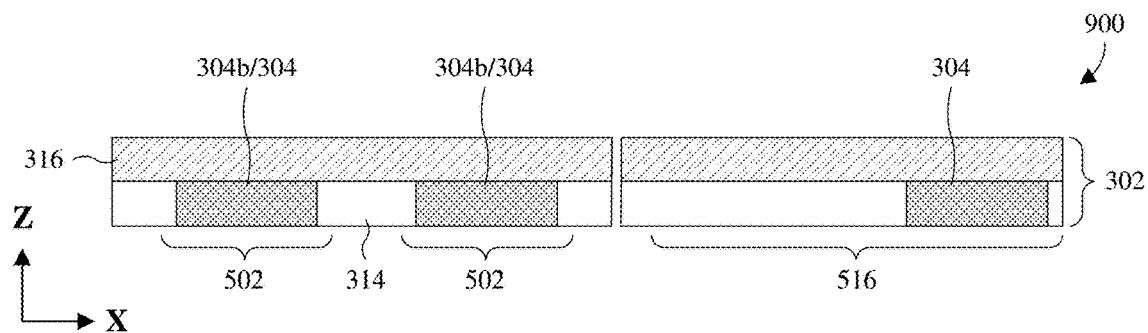

As illustrated by the cross-sectional view 900 of FIG. 9, a via dielectric layer 316 is deposited or otherwise formed on the interconnect structure 302. Note that for drawing compactness, a lower portion of the interconnect structure 302 is omitted herein and in subsequent figures. The via dielectric layer 316 may, for example, be or comprise silicon carbide, silicon-rich oxide, some other suitable dielectric(s), or any combination of the foregoing.

Figure 10:
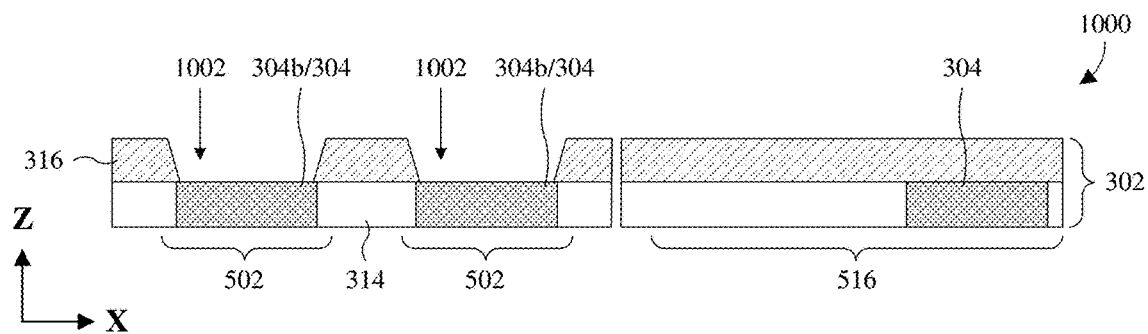

As illustrated by the cross-sectional view 1000 of FIG. 10, the via dielectric layer 316 is patterned to form via openings 1002 individual to and respectively at the 1T1R cells 502 being formed. The via openings 1002 extend through the via dielectric layer 316 and respectively expose the bottom-electrode wires 304b. The patterning may, for example, be performed by a photolithography/etching process or some other suitable patterning process.

Figure 11:
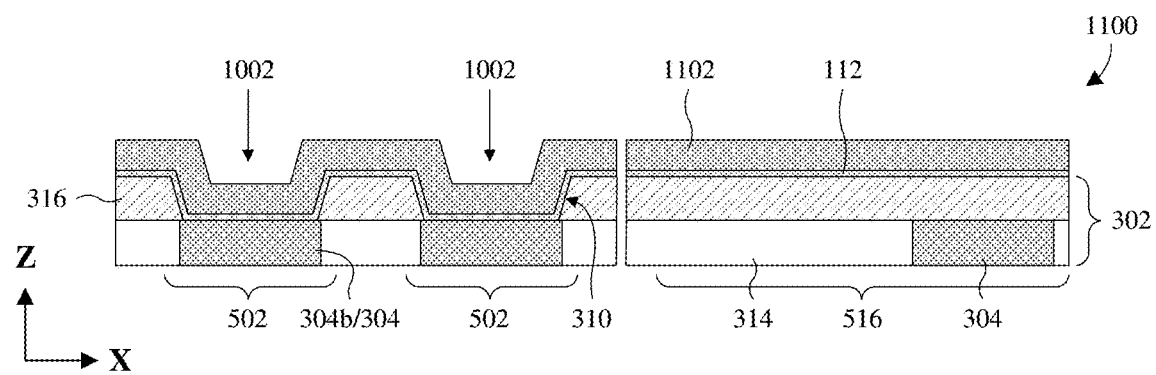

As illustrated by the cross-sectional view 1100 of FIG. 11, a bottom-electrode barrier layer 112 and a bottom electrode layer 1102 are deposited covering the via dielectric layer 316 and lining the via openings 1002. In alternative embodiments, the bottom-electrode barrier layer 112 is omitted. Portions of the bottom-electrode barrier layer 112 and the bottom electrode layer 1102 in the via openings 1002 at least partially form bottom-electrode vias 310.

The bottom-electrode barrier layer 112 is configured to block or otherwise resist diffusion of the active metal atoms of the bottom-electrode wires 304b from the bottom-electrode wires 304b to the bottom electrode layer 1102. In some embodiments, the bottom-electrode barrier layer 112 blocks or otherwise resists the diffusion by: 1) being more amorphous and/or less crystalline than that of the bottom-electrode wires 304b; 2) having an average crystalline grain size larger or smaller than that of the bottom-electrode wires 304b; 3) having a different lattice constant than that of the bottom-electrode wires 304b; 4) being made up of atoms having larger and/or smaller atomic radii than the active metal atoms; or 5) any combination of the foregoing.

In some embodiments, the bottom-electrode barrier layer 112 is or comprises non-active metal atoms. Further, in some embodiments, the bottom-electrode barrier layer 112 consists essentially of non-active metal atoms and/or, amongst all metal atoms in the bottom-electrode barrier layer 112, the metal atoms consist essentially of non-active metal atoms. As used herein, non-active metal atoms are metal atoms that have a low diffusion coefficient. A low diffusion coefficient may, for example, be a diffusion coefficient that is less than about $10^{-13}$ cm$^2$s$^{-1}$, $10^{-14}$ cm$^2$s$^{-1}$, $10^{-15}$ cm$^2$s$^{-1}$, or some other suitable amount.

In some embodiments, the bottom-electrode barrier layer 112 is or comprises active metal atoms. Further, in some embodiments, the bottom-electrode barrier layer 112 consists essentially of active metal atoms and/or, amongst all metal atoms in the bottom-electrode barrier layer 112, the metal atoms consist essentially of active metal atoms. Active metal atoms are metal atoms having a high diffusion coefficient. A high diffusion coefficient may, for example, be a diffusion coefficient in excess of about $10^{-13}$ cm$^2$s$^{-1}$ or some other suitable amount.

In some of embodiments in which the bottom-electrode barrier layer 112 comprises active metal atoms, the active metal atoms of the bottom-electrode wires 304b correspond to a different metal element than the active metal atoms of the bottom-electrode barrier layer 112. For example, the active metal atoms of the bottom-electrode wires 304b may correspond to copper, whereas the active metal atoms of the bottom-electrode barrier layer 112 may correspond to tantalum. Other suitable metal elements are, however, amenable. In some embodiments, the active metal atoms of the bottom-electrode barrier layer 112 have a first diffusion coefficient, whereas the active metal atoms of the bottom-electrode wires 304b have a second diffusion coefficient that is greater than or otherwise different than the first diffusion coefficient.

In some embodiments in which the bottom-electrode barrier layer 112 comprises active metal atoms, the bottom electrode layer 1102 blocks or otherwise resists diffusion of the active metal atoms. In some embodiments, the bottom electrode layer 1102 blocks or otherwise resists the diffusion by: 1) being more amorphous and/or less crystalline than that of the bottom-electrode barrier layer 112; 2) having an average crystalline grain size larger or smaller than that of the bottom-electrode barrier layer 112; 3) having a different lattice constant than that of the bottom-electrode barrier layer 112; 4) being made up of atoms having larger and/or smaller atomic radii than the active metal atoms; or 5) any combination of the foregoing.

In some embodiments, the bottom electrode layer 1102 is or comprises tantalum nitride, molybdenum, titanium nitride, tungsten nitride, iridium, ruthenium, or the like. It has been appreciated that such materials block or otherwise resist diffusion of active metal atoms, including copper, tantalum, and the like. In some embodiments, the bottom electrode layer 1102 is or comprises titanium nitride with an atomic percentage of nitrogen that is about 50% or some other suitable percentage, whereas the bottom-electrode barrier layer 112 is or comprises tantalum and/or tantalum nitride. Other suitable materials are, however, amenable.

To the extent that the bottom electrode layer 1102 blocks or otherwise resists diffusion of active metal atoms, the bottom electrode layer 1102 may prevent the active metal atoms from diffusing to and contaminating a switching layer subsequently deposited over the bottom electrode layer 1102. Contamination of the switching layer with the active metal atoms may lead to increased leakage current, which negatively affects reliability, breakdown voltage, and other suitable properties of the memory cells being formed. Therefore, by blocking or otherwise resisting the diffusion, the bottom electrode layer 1102 may reduce leakage current and enhance performance of the memory cells being formed.

In some embodiments in which the bottom-electrode barrier layer 112 comprises active metal atoms, the bottom electrode layer 1102 passes or otherwise enables diffusion of the active metal atoms and hence does not block or otherwise resist diffusion of the active metal atoms. In some embodiments, the bottom-electrode barrier layer 112 is or comprises non-active metal atoms. Further, in some embodiments, the bottom-electrode barrier layer 112 consists essentially of non-active metal atoms and/or, amongst all metal atoms in the bottom-electrode barrier layer 112, the metal atoms consist essentially of non-active metal atoms. In some embodiments, the bottom electrode layer 1102 is or comprises active metal atoms. In some embodiments, the bottom electrode layer 1102 consists essentially of active metal atoms and/or, amongst all metal atoms in the bottom electrode layer 1102, the metal atoms consist essentially of active metal atoms.

Figure 12:
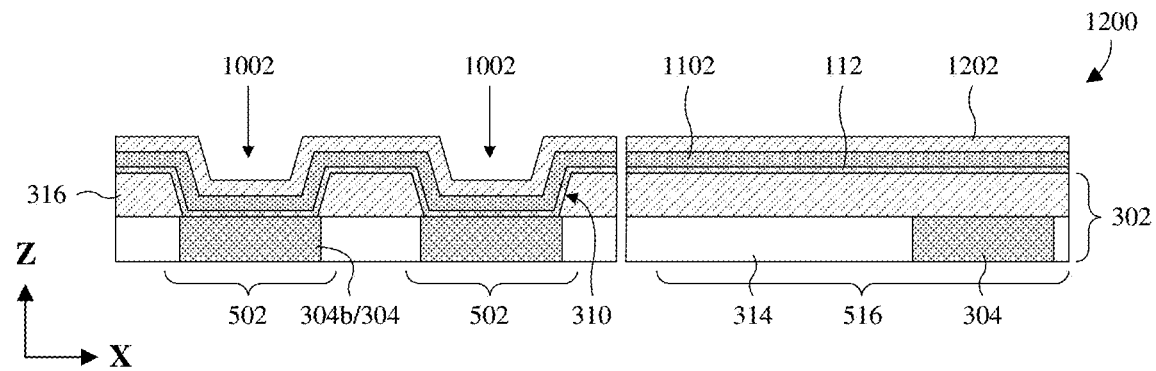

As illustrated by the cross-sectional view 1200 of FIG. 12, a bottom-electrode interface layer 1202 is formed over the bottom electrode layer 1102 and lining the via openings 1002. The bottom-electrode interface layer 1202 is dielectric and is a different material than the bottom electrode layer 1102. The bottom-electrode interface layer 1202 is configured to block or otherwise resist active metal atoms and/or impurities from diffusing through the bottom-electrode interface layer 1202. In some embodiments, the bottom-electrode interface layer 1202 blocks or otherwise resists the diffusion by: 1) being more amorphous and/or less crystalline than that of the bottom electrode layer 1102; 2) having an average crystalline grain size larger or smaller than that of the bottom electrode layer 1102; 3) having a different lattice constant than that of the bottom electrode layer 1102; 4) being made up of atoms having larger and/or smaller atomic radii than the active metal atoms and/or impurities; or 5) any combination of the foregoing.

As seen hereafter, a switching layer is subsequently formed overlying the bottom-electrode interface layer 1202. By blocking or otherwise resisting diffusion, the bottom-electrode interface layer 1202 prevents the active metal atoms and/or the impurities from diffusing into the switching layer. To the extent that the active metal atoms and/or the impurities diffuse into the switching layer, leakage current may be increased and hence endurance may be decreased. Therefore, by blocking or otherwise resisting the diffusion, the bottom-electrode interface layer 1202 may reduce leakage current. Reducing leakage current, in turn, enhances reliability and increases breakdown voltage of the memory cells being formed.

In some embodiments, the bottom-electrode interface layer 1202 is or comprises a metal oxide, a metal nitride, a metal oxynitride, or the like. For example, the bottom-electrode interface layer 1202 may be or comprise titanium oxide, titanium nitride, titanium oxynitride, tantalum oxide, tantalum nitride, tantalum oxynitride, or the like. In at least some embodiments in which the bottom electrode layer 1102 is or comprises titanium nitride, the bottom-electrode interface layer 1202 is or comprises titanium oxynitride or the like. In at least some embodiments in which the bottom electrode layer 1102 is or comprises tantalum nitride, the bottom-electrode interface layer 1202 is or comprises tantalum oxynitride or the like.

In some embodiments, the bottom-electrode interface layer 1202 comprises non-active metal atoms and/or, amongst all metal atoms in the bottom-electrode interface layer 1202, the metal atoms consist essentially of non-active metal atoms. In some embodiments, the bottom-electrode interface layer 1202 comprises active metal atoms and/or, amongst all metal atoms in the bottom-electrode interface layer 1202, the metal atoms consist essentially of active metal atoms. In some embodiments, the bottom-electrode interface layer 1202 shares a common metal element with the bottom electrode layer 1102. In some embodiments, the bottom-electrode interface layer 1202 is devoid of a remanent polarization and is hence not ferroelectric. Such embodiments may arise at least when the memory cells being formed are FeRAM cells and RRAM cells.

In some embodiments, a process for forming the bottom-electrode interface layer 1202 is or comprises plasma treatment of the bottom electrode layer 1102. The plasma treatment may, for example, be performed to oxidize and/or introduce nitrogen into a top portion of the bottom electrode layer 1102, thereby forming the bottom-electrode interface layer 1202 from the top portion. In some embodiments, the plasma treatment decreases crystallinity and/or increases amorphousness at the top portion and hence at the bottom-electrode interface layer 1202. The plasma treatment comprises generating plasma from a process gas and exposing the bottom electrode layer 1102 to the plasma. In some embodiments, the plasma treatment is performed with: 1) a process power greater than about 600 watts or some other suitable value; 2) a process temperature of about 200-500 degrees Celsius (° C.), about 200-350° C., about 350-500°

C., or some other suitable value; 3) a process gas being or comprising ammonia (e.g., $NH_3$), nitrogen gas (e.g., $N_2$), nitrous oxide (e.g., $N_2O$), oxygen gas (e.g., $O_2$), some other suitable gas, or any combination of the foregoing; 4) a process temperature of about 1-10 torr, about 1-5.5 torr, about 5.5-10 torr, or some other suitable value; 5) or any combination of the foregoing.

Figure 13:
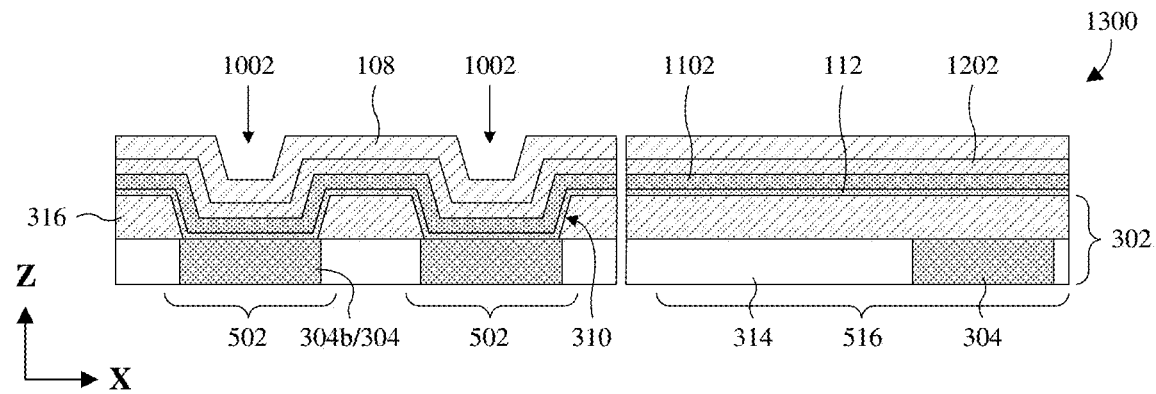

As illustrated by the cross-sectional view 1300 of FIG. 13, a switching layer 108 is deposited or otherwise formed over the bottom-electrode interface layer 1202. The switching layer 108 has a property used to represent a bit of data and configured to reversibly switch between a first state and a second state. For example, the switching layer 108 may be ferroelectric, whereby a remanent polarization of the switching layer 108 may be used to represent the bit of data. A first state of the remanent polarization represents a binary "1", whereas a second state of the remanent polarization represents a binary "0", or vice versa.

In some embodiments, the switching layer 108 is or comprises a hafnium oxide-based film, a zirconium oxide-based film, or the like in the orthorhombic phase. For example, the switching layer 108 may be or comprise hafnium zirconium oxide (e.g., HfZrO or HZO), hafnium aluminum oxide (e.g., HfAlO), hafnium lanthanum oxide (e.g., HfLaO), hafnium cerium oxide (e.g., HfCeO), hafnium oxide (e.g., HfO), hafnium silicon oxide (e.g., HfSiO), hafnium gadolinium oxide (e.g., HfGdO), or the like. In some embodiments, the switching layer 108 is doped with dopants having an atomic percentage at or less than about 50%, 40%, 25%, or some other suitable percentage. The dopants may, for example, be or comprise aluminum (e.g., Al), silicon (e.g., Si), lanthanum (e.g., La), scandium (e.g., Sc), calcium (e.g., Ca), barium (e.g., Ba), gadolinium (e.g., Gd), yttrium (e.g., Y), strontium (e.g., Sr), some other suitable element(s), or any combination of the foregoing. In some embodiments, the switching layer 108 is a high k dielectric and/or a metal oxide. In embodiments in which the memory cells being formed are FeRAM cells and hence the switching layer 108 is ferroelectric, the switching layer 108 has a ratio of orthorhombic, tetragonal, and cubic phases to orthorhombic, tetragonal, cubic, and monoclinic phases that is greater than about 0.5 or some other suitable value.

The switching layer 108 may be deposited by ALD, chemical vapor deposition (CVD), or some other suitable deposition process. In at least some embodiments in which the switching layer 108 is deposited by ALD, the bottom-electrode interface layer 1202 is exposed to gaseous precursors. The gaseous precursors may, for example, be or include chlorine precursors, oxide precursors, other suitable gaseous precursors, or any combination of the foregoing.

The bottom-electrode interface layer 1202 is configured to block or otherwise resist diffusion of the gaseous precursors. Absent the bottom-electrode interface layer 1202, the gaseous precursors may diffuse into the bottom electrode layer 1102 and may cause impurities in the bottom electrode layer 1102. For example, chloride and/or oxide precursors may diffuse into the bottom electrode layer 1102 and may cause impurities comprising chlorine ions (e.g., $Cl^-$) and/or oxygen ions ($O^-$). Further, absent the bottom-electrode interface layer 1202, the impurities may diffuse from the bottom electrode layer 1102 to the switching layer 108 after deposition of the switching layer 108. This may cause an increase in leakage current, which may degrade data retention and hence reliability of the memory cells being formed. Accordingly, by preventing the foregoing behavior, the bottom-electrode interface layer 1202 may reduce leakage current. This may, in turn, enhances data retention and hence reliability of the memory cells being formed.

In some embodiments, the bottom-electrode interface layer 1202 blocks or otherwise resists the diffusion by: 1) being more amorphous and/or less crystalline than that of the bottom electrode layer 1102 and/or the switching layer 108; 2) having an average crystalline grain size larger or smaller than that of the bottom electrode layer 1102 and/or the switching layer 108; 3) having a different lattice constant than that of the bottom electrode layer 1102 and/or the switching layer 108; 4) being made up of atoms having larger and/or smaller atomic radii than the diffusing atoms to be blocked or otherwise resisted; or 5) is/has any combination of the foregoing.

In some embodiments, the bottom-electrode interface layer 1202 is also inert to the gaseous precursors used during the deposition of the switching layer 108. By inert, it is meant that the bottom-electrode interface layer 1202 does not react with the gaseous precursors and/or depends on more energy to react with the gaseous precursors than the bottom electrode layer 1102. Because of the inertness, the gaseous precursors may more completely react with each other, thereby reducing the likelihood of unreactive precursors or partially reacted precursors contaminating the switching layer 108 and increasing leakage current. Therefore, the bottom-electrode interface layer 1202 may further reduce leakage current, which may enhance data retention and hence reliability of the memory cells being formed.

In some embodiments, the bottom electrode layer 1102 is reactive with the gaseous precursors, whereas the bottom-electrode interface layer 1202 is inert and/or not reactive with the gaseous precursors. In at least some of such embodiments, omission of the bottom-electrode interface layer 1202 may lead to unreactive or partially reacted precursors that may contaminate the switching layer 108 and may hence increase leakage current.

Figure 14:
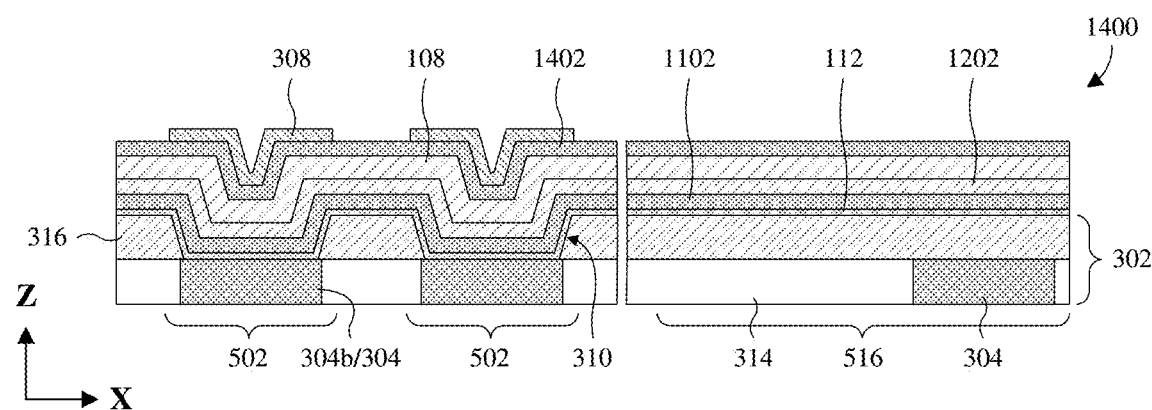

As illustrated by the cross-sectional view 1400 of FIG. 14, a top electrode layer 1402 is deposited over the switching layer 108. The top electrode layer 1402 may, for example, be deposited by physical vapor deposition (PVD), CVD, some other suitable deposition process(es), or any combination of the foregoing.

Also illustrated by the cross-sectional view 1400 of FIG. 14, hard masks 308 individual to and respectively at the 1T1R cells 502 are formed. As seen hereafter, the hard masks 308 have patterns for memory cells of the 1T1R cells 502. The hard masks 308 may, for example, be formed by depositing a hard mask layer over the top electrode layer 1402 and subsequently patterning the hard mask layer into the hard masks 308. The patterning may, for example, be performed by a photolithography/etching process or some other suitable patterning process.

Figure 15:
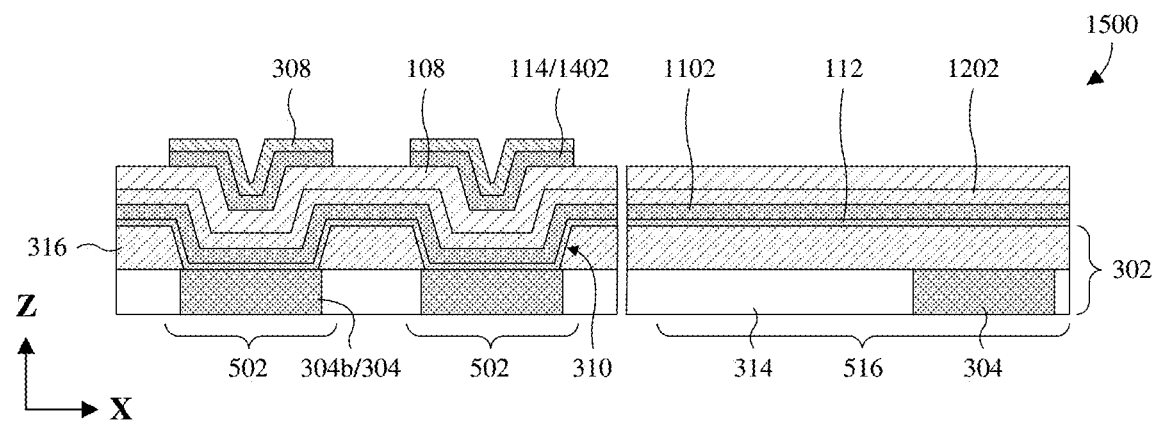

As illustrated by the cross-sectional view 1500 of FIG. 15, a first etch is performed into the top electrode layer 1402 (see, e.g., FIG. 14) with the hard masks 308 in place. The first etch stops on the switching layer 108 and transfers patterns of the hard masks 308 to top electrode layer 1402 to form top electrodes 114 individual to and respectively at the 1T1R cells 502.

Figure 16:
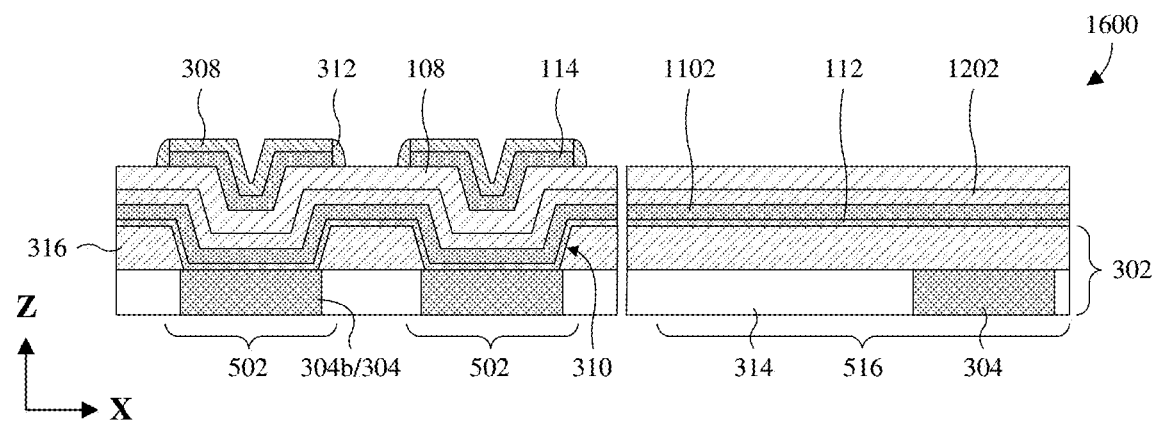

As illustrated by the cross-sectional view 1600 of FIG. 16, sidewall spacer structures 312 are formed overlying the switching layer 108 on common sidewalls formed by the hard masks 308 and the top electrodes 114. A process for forming the sidewall spacer structure 312 may, for example, comprise: 1) depositing a spacer layer covering and lining the switching layer 108 and the hard masks 308 and further lining the common sidewalls; and 2) etching back the spacer layer. Other suitable processes are, however, amenable.

Figure 17:
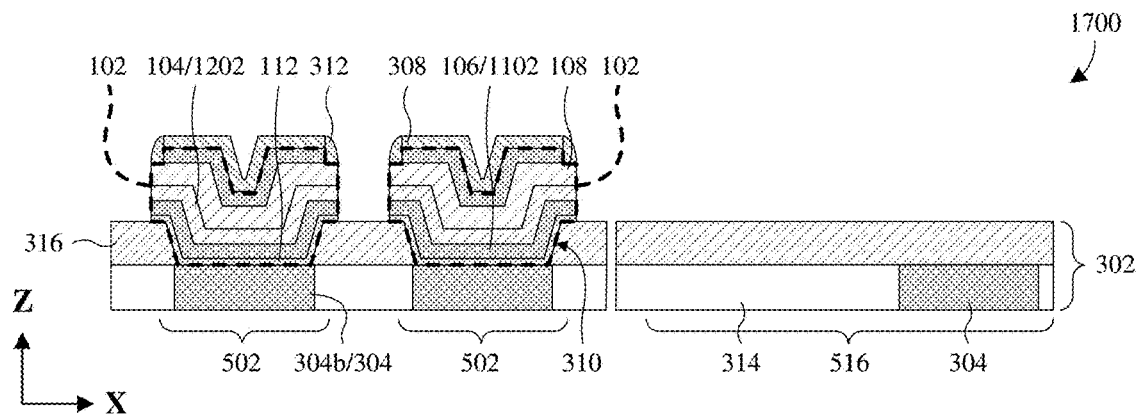

As illustrated by the cross-sectional view 1700 of FIG. 17, a second etch is performed into the switching layer 108, the bottom-electrode interface layer 1202, the bottom electrode layer 1102, and the bottom-electrode barrier layer 112 with the sidewall spacer structures 312 and the hard masks 308 in place. The second etch stops on the via dielectric layer 316 and transfers patterns of the hard masks 308 and the sidewall spacer structures 312 to the switching layer 108, the bottom-electrode interface layer 1202, the bottom electrode layer 1102, and the bottom-electrode barrier layer 112. The second etch divides the switching layer 108, the bottom-electrode interface layer 1202, the bottom electrode layer 1102, and the bottom-electrode barrier layer 112 into segments individual to and respectively at the 1T1R cells 502.

The segments of the bottom electrode layer 1102 are hereafter referred to as bottom electrodes 106, whereas the segments of the bottom-electrode interface layer 1202 are hereafter referred to as bottom-electrode interface structures 104. The bottom and top electrodes 106, 114 and the bottom-electrode interface structures 104, as well as the segments of the switching layer 108 and the bottom-electrode barrier layer 112, collectively form memory cells 102 respectively at the 1T1R cells 502. In embodiments in which the switching layer 108 is ferroelectric, the memory cells 102 may be FeRAM cells.

Figure 18:
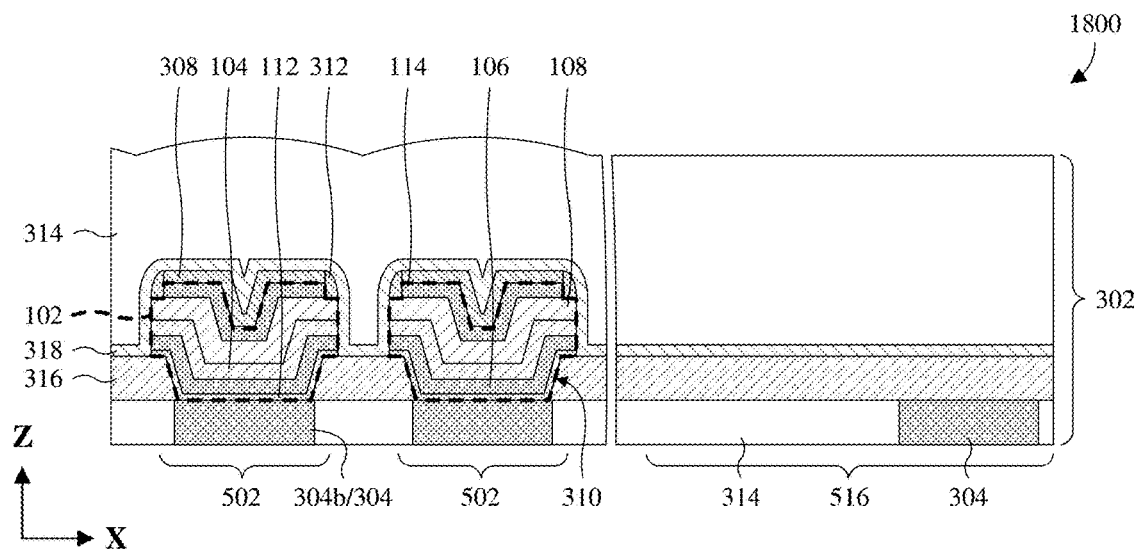
Figure 19:
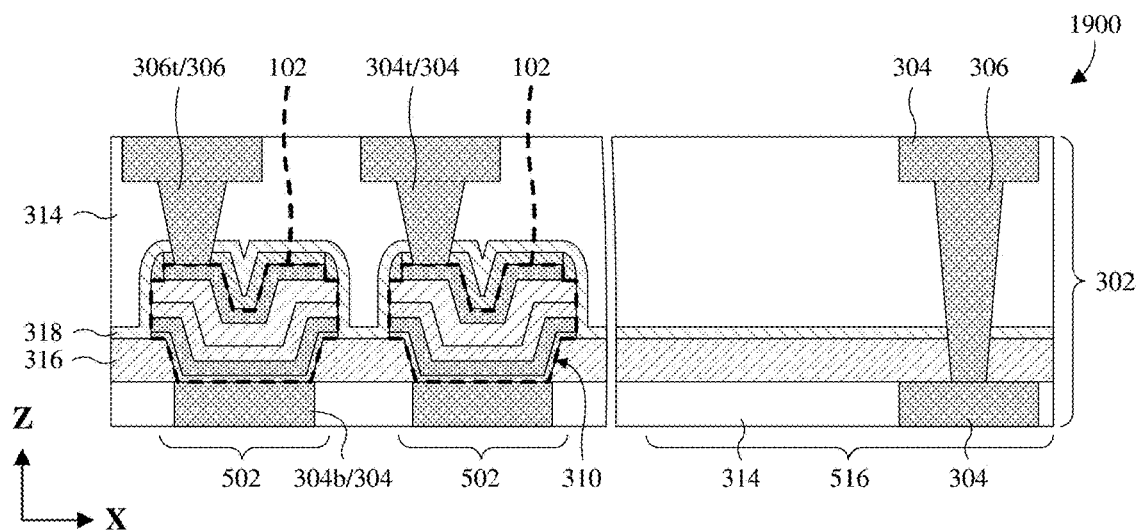

As illustrated by the cross-sectional views 1800, 1900 of FIGS. 18 and 19, the interconnect structure 302 is completed over the memory cells 102. At FIG. 18, an etch stop layer 318 is deposited over and lining the memory cells 102. Further, an additional IMD layer 314 is deposited over the etch stop layer 318. At FIG. 19, a plurality of additional wires 304 and a plurality of additional vias 306 are formed over the memory cells 102, recessed into the additional IMD layer 314 above the memory cells 102. The plurality of additional wires 304 comprises top-electrode wires 304*t* individual to and respectively overlying the memory cells 102. The plurality of additional vias 306 comprise top-electrode vias 306*t* individual to and respectively overlying the memory cells 102. Further, the top-electrode vias 306*t* extend respectively from the top-electrode wires 304*t* respectively to the memory cells 102.

While FIGS. 8-19 are described with reference to a method, it will be appreciated that the structures shown in FIGS. 8-19 are not limited to the method but rather may stand alone separate of the method. While FIGS. 8-19 are described as a series of acts, it will be appreciated that the order of the acts may be altered in other embodiments. While FIGS. 8-19 illustrate and describe as a specific set of acts, some acts that are illustrated and/or described may be omitted in other embodiments. Further, acts that are not illustrated and/or described may be included in other embodiments. While FIGS. 8-19 illustrate the method with embodiments of the memory cells 102 in FIG. 4D, alternative embodiments of the method may be performed for embodiments of the memory cells 102 in any one or combination of FIGS. 1, 2A-2C, 3, and 4A-4C.

Figure 20:
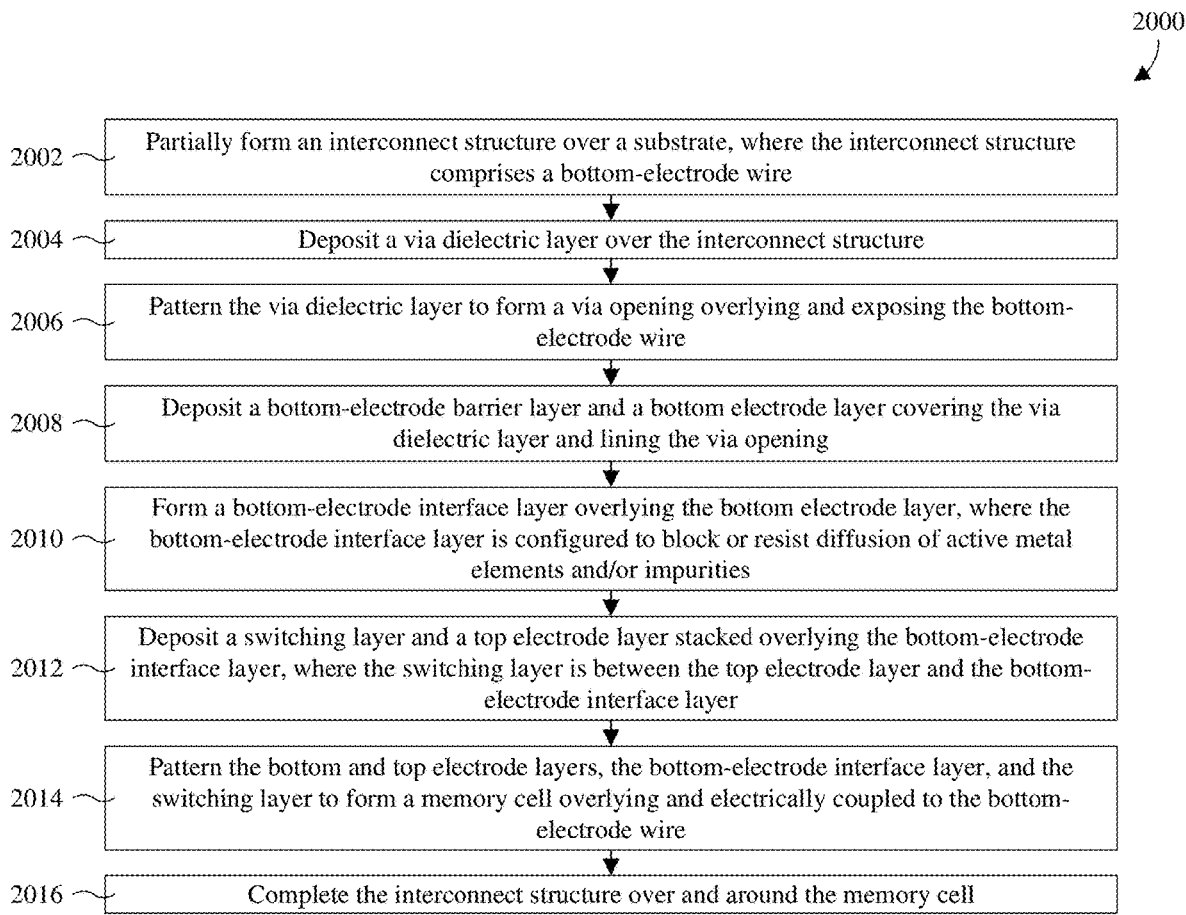
FIG. 20 illustrates a block diagram of some embodiments of the method of FIGS. 8-19.

With reference to FIG. 20, a block diagram 2000 of some embodiments of the method of FIGS. 8-19 is provided.

At 2002, an interconnect structure is partially formed over a substrate, where the interconnect structure comprises a bottom-electrode wire. See, for example, FIG. 8.

At 2004, a via dielectric layer is deposited over the interconnect structure. See, for example, FIG. 9.

At 2006, the via dielectric layer is patterned to form a via opening overlying and exposing the bottom-electrode wire. See, for example, FIG. 10.

At 2008, a bottom-electrode barrier layer and a bottom electrode layer are deposited covering the via dielectric layer and lining the via opening. See, for example, FIG. 11.

At 2010, a bottom-electrode interface layer is formed overlying the bottom electrode layer, where the bottom-electrode interface layer is configured to block or resist diffusion of active metal elements and/or impurities. See, for example, FIG. 12.

At 2012, a switching layer and a top electrode layer are deposited stacked overlying the bottom-electrode interface layer, where the switching layer is between the top electrode layer and the bottom-electrode interface layer. See, for example, FIGS. 13 and 14. In some embodiments, the memory cell being formed is an FeRAM cell, whereby the switching layer is ferroelectric. In other embodiments, the memory cell is some other suitable type of memory cell, whereby the switching layer is some other suitable type of material.

At 2014, the bottom and top electrode layers, the bottom-electrode interface structure, and the FSL are patterned to form a memory cell overlying and electrically coupled to the bottom-electrode wire. See, for example, FIGS. 15-17.

At 2016, the interconnect structure is completed over and around the memory cell. See, for example, FIGS. 18 and 19.

While the block diagram 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC chip including a memory cell, wherein the memory cell includes: a bottom electrode; a switching layer over the bottom electrode; a top electrode over the switching layer; and an interface structure separating the bottom electrode and the switching layer from each other, wherein the interface structure is dielectric and is configured to block metal atoms and/or impurities in the bottom electrode from diffusing to the switching layer. In some embodiments, the interface structure is more amorphous than the bottom electrode. In some embodiments, the switching layer is ferroelectric. In some embodiments, the bottom electrode and the interface structure share a common metal element. In some embodiments, the interface structure is a metal oxide, a metal nitride, or a metal oxynitride. In some embodiments, the bottom electrode is a metal nitride, and wherein the interface structure is a metal oxynitride. In some embodiments, the IC chip further includes: a wire underlying the bottom electrode; and a barrier layer separating the wire from the bottom electrode and configured to block material of the wire from diffusing to the bottom electrode; wherein the barrier layer includes active metal atoms having a diffusion coefficient in excess of about $10^{-13}$ cm$^2$s$^{-1}$, and wherein the bottom electrode is configured to block diffusion of the active metal atoms. In some embodiments, the IC chip further includes: a wire underlying the bottom electrode; and a barrier layer separating the wire from the bottom electrode and configured to block material of the wire from diffusing to the bottom electrode; wherein the barrier layer includes tantalum, and wherein the bottom electrode includes molybdenum, titanium nitride, tungsten nitride, iridium, ruthenium.

In some embodiments, the present disclosure provides an IC chip including a FeRAM cell, wherein the FeRAM cell includes: a bottom electrode; a ferroelectric switching layer over the bottom electrode; a top electrode over the ferroelectric switching layer; and an interface structure separating the bottom electrode and the ferroelectric switching layer, wherein the interface structure is dielectric and includes a metal element and a non-metal element, wherein the metal element is common to the interface structure and the bottom electrode, and wherein the non-metal element decreases in concentration from a top of the interface structure to a bottom of the interface structure. In some embodiments, the bottom electrode is devoid of the non-metal element. In some embodiments, the interface structure further includes a second non-metal element common to the interface structure and the bottom electrode. In some embodiments, the concentration discretely changes from the top to the bottom. In some embodiments, the non-metal element includes oxygen or nitrogen. In some embodiments, the IC chip further includes an additional interface structure separating the top electrode and the ferroelectric switching layer from each other, wherein the additional interface structure is dielectric and is configured to block metal atoms and/or impurities in the top electrode from diffusing to the ferroelectric switching layer. In some embodiments, the IC chip further includes a wire underlying and directly contacting the bottom electrode; wherein the wire and the bottom electrode include active metal atoms having a diffusion coefficient in excess of about $10^{-13}$ $cm^2s^{-1}$, and wherein the interface structure is configured to block diffusion of the active metal atoms to the ferroelectric switching layer.

In some embodiments, the present disclosure provided a method including: depositing a bottom electrode layer overlying and electrically coupled to a wire; plasma treating a top surface of the bottom electrode layer to form an interface layer overlying the bottom electrode layer; depositing a switching layer overlying the interface layer using a precursor gas, wherein the interface layer is configured to block the precursor gas from diffusing to and interacting with the bottom electrode layer; depositing a top electrode layer over the switching layer; and patterning the bottom and top electrode layers, the switching layer, the interface layer to form a memory cell. In some embodiments, the interface layer depends on more energy to react with the precursor gas than the bottom electrode layer. In some embodiments, the plasma treating includes generating plasma from a gas including oxygen and/or nitrogen. In some embodiments, the plasma treating forms the interface layer from a top portion of the bottom electrode layer and decreases crystallinity at the top portion. In some embodiments, the method further includes depositing a barrier layer overlying the wire and including metal atoms; wherein the bottom electrode layer is deposited over the barrier layer, wherein the metal atoms diffuse from the barrier layer to the bottom electrode layer, and wherein the interface layer is configured to block migration of the metal atoms from the bottom electrode layer to the switching layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip comprising a memory cell, wherein the memory cell comprises:
   a bottom electrode;
   a switching layer over the bottom electrode;
   a top electrode over the switching layer; and
   an interface structure separating the bottom electrode and the switching layer from each other, wherein the interface structure is dielectric;
   wherein the bottom electrode comprises a metal nitride, wherein the interface structure comprises a metal oxynitride at a first interface with the bottom electrode, and wherein chlorine ions are at the interface structure and decrease in concentration from the switching layer to the bottom electrode.

2. The IC chip according to claim 1, wherein the switching layer overlies and directly contacts the interface structure at a second interface, and wherein the interface structure comprises the metal oxynitride at the second interface.

3. The IC chip according to claim 1, wherein the interface structure is more amorphous than the bottom electrode.

4. The IC chip according to claim 1, wherein the bottom electrode and the interface structure share a common metal element.

5. The IC chip according to claim 1, wherein the interface structure is configured to block metal atoms and/or impurities in the bottom electrode from diffusing to the switching layer.

6. The IC chip according to claim 1, further comprising:
   a wire underlying the bottom electrode; and
   a barrier layer separating the wire from the bottom electrode and configured to block material of the wire from diffusing to the bottom electrode;
   wherein the barrier layer comprises active metal atoms having a diffusion coefficient more than about $10^{-13}$ squared centimeters per second ($cm^2s^{-1}$), and wherein the bottom electrode is configured to block diffusion of the active metal atoms.

7. The IC chip according to claim 1, further comprising:
   a wire underlying the bottom electrode; and
   a barrier layer separating the wire from the bottom electrode and configured to block material of the wire from diffusing to the bottom electrode;
   wherein the barrier layer comprises tantalum, and wherein the bottom electrode comprises titanium nitride or tungsten nitride.

8. The IC chip according to claim 1, wherein the interface structure is between and contacts the bottom electrode and the switching layer, wherein the switching layer is between and contacts the interface structure and the top electrode, and wherein the switching layer is a single ferroelectric material from the interface structure to the top electrode.

9. An integrated circuit (IC) chip comprising a ferroelectric random-access memory (FeRAM) cell, wherein the FeRAM cell comprises:
   a bottom electrode;
   a ferroelectric switching layer over the bottom electrode;
   a top electrode over the ferroelectric switching layer; and
   an interface structure separating the bottom electrode and the ferroelectric switching layer from each other, wherein the interface structure is dielectric and consists essentially of a metal element and a non-metal element, wherein the metal element is common to the interface structure and the bottom electrode, and wherein the non-metal element is oxygen and decreases in concentration from a top of the interface structure to a bottom of the interface structure.

10. The IC chip according to claim 9, wherein the bottom electrode is devoid of the non-metal element.

11. The IC chip according to claim 9, wherein the concentration discretely changes from the top of the interface structure to the bottom of the interface structure.

12. The IC chip according to claim 9, wherein the top of the interface structure directly contacts the ferroelectric switching layer, and wherein the bottom of the interface structure directly contacts the bottom electrode.

13. The IC chip according to claim 9, further comprising:
an additional interface structure separating the top electrode and the ferroelectric switching layer from each other, wherein the additional interface structure is dielectric and is configured to block metal atoms and/or impurities in the top electrode from diffusing to the ferroelectric switching layer.

14. The IC chip according to claim 9, further comprising:
a wire underlying and directly contacting the bottom electrode;
wherein the wire and the bottom electrode comprise active metal atoms having a diffusion coefficient more than about $10^{-13}$ squared centimeters per second ($cm^2s^{-1}$), and wherein the interface structure is configured to block diffusion of the active metal atoms to the ferroelectric switching layer.

15. An integrated circuit (IC) chip, comprising:
a wire; and
a memory cell overlying the wire and comprising:
a bottom electrode;
a metal oxide layer overlying the bottom electrode;
a top electrode overlying the metal oxide layer; and
an interface structure separating the bottom electrode and the metal oxide layer from each other, and further comprising a non-metal element;
wherein the bottom electrode is a single material, which comprises a metal element and extends from the wire to the interface structure, and wherein the metal element has a diffusion coefficient greater than an active-metal value of $10^{-13}$ squared centimeters per second ($cm^2s^{-1}$).

16. The IC chip according to claim 15, wherein the bottom electrode defines a via protruding towards the wire at a bottom of the bottom electrode.

17. The IC chip according to claim 16, wherein the metal oxide layer overlies and directly contacts the interface structure.

18. The IC chip according to claim 15, wherein the metal element is copper or tantalum.

19. The IC chip according to claim 15, wherein the single material consists essentially of the metal element, and wherein the interface structure consists essentially of a metal oxide, which comprises the metal element.

20. The IC chip according to claim 9, further comprising:
an additional interface structure between and contacting the top electrode and the ferroelectric switching layer, wherein the interface structure is between and contacts the bottom electrode and the ferroelectric switching layer, and wherein the ferroelectric switching layer is a single ferroelectric material from the interface structure to the additional interface structure.

* * * * *